(12) United States Patent
Braje et al.

(10) Patent No.: US 11,448,676 B2
(45) Date of Patent: *Sep. 20, 2022

(54) SPIN-BASED ELECTROMETRY WITH SOLID-STATE DEFECTS

(71) Applicant: Massachusetts Institute of Technology, Cambridge, MA (US)

(72) Inventors: Danielle Ann Braje, Winchester, MA (US); Edward H. Chen, Cambridge, MA (US); Phillip R. Hemmer, College Station, TX (US)

(73) Assignee: Massachusetts Institute of Technology, Cambridge, MA (US)

( * ) Notice: Subject to any disclaimer, the term of this patent is extended or adjusted under 35 U.S.C. 154(b) by 295 days.

This patent is subject to a terminal disclaimer.

(21) Appl. No.: 16/819,268

(22) Filed: Mar. 16, 2020

(65) Prior Publication Data

US 2020/0284828 A1    Sep. 10, 2020

Related U.S. Application Data

(63) Continuation of application No. 15/635,852, filed on Jun. 28, 2017, now Pat. No. 10,620,251.

(Continued)

(51) Int. Cl.
*G01R 29/08* (2006.01)
*G01R 33/32* (2006.01)

(52) U.S. Cl.
CPC ....... *G01R 29/0885* (2013.01); *G01R 33/323* (2013.01)

(58) Field of Classification Search
CPC ............ G01R 31/2884; G01R 31/2856; G01R 31/3004; G01R 31/3016; G01R 31/2872; G11C 29/12005
See application file for complete search history.

(56) References Cited

U.S. PATENT DOCUMENTS 8,138,756 B2    3/2012 Barclay et al.
9,766,181 B2    9/2017 Englund et al.
(Continued)

FOREIGN PATENT DOCUMENTS

WO    2016118791 A1    7/2016

OTHER PUBLICATIONS

Acosta, V. M. et al., "Electromagnetically Induced Transparency in a Diamond Spin Ensemble Enables All-Optical Electromagnetic Field Sensing," Physical Review Letters, vol. 110, pp. 213605-1-6 (May 2013).

(Continued)

*Primary Examiner* — Christopher P McAndrew
*Assistant Examiner* — Zannatul Ferdous
(74) *Attorney, Agent, or Firm* — Smith Baluch LLP

(57) ABSTRACT

Sensing the electric or strain field experienced by a sample containing a crystal host comprising of solid state defects under a zero-bias magnetic field can yield a very sensitive measurement. Sensing is based on the spin states of the solid-state defects. Upon absorption of suitable microwave (and optical) radiation, the solid-state defects emit fluorescence associated with hyperfine transitions. The fluorescence is sensitive to electric and/or strain fields and is used to determine the magnitude and/or direction of the field of interest. The present apparatus is configured to control and modulate the assembly of individual components to maintain a zero-bias magnetic field, generate an Optically Detected Magnetic Resonance (ODMR) spectrum (with or without optical excitation) using appropriate microwave radiation, detect signals based on the hyperfine state transitions that are sensitive to electric/strain fields, and to quantify the magnitude and direction of the field of interest.

20 Claims, 18 Drawing Sheets

Related U.S. Application Data

(60) Provisional application No. 62/355,448, filed on Jun. 28, 2016.

(56) References Cited

U.S. PATENT DOCUMENTS

| | | | |
|---|---|---|---|
| 10,197,515 | B2 | 2/2019 | Clevenson et al. |
| 10,620,251 | B2* | 4/2020 | Braje ................ G01R 29/0885 |
| 10,648,934 | B2 | 5/2020 | Kim et al. |
| 2014/0191139 | A1* | 7/2014 | Englund ............... G01N 21/64 536/23.1 |
| 2015/0001422 | A1 | 1/2015 | Englund et al. |
| 2015/0090033 | A1* | 4/2015 | Budker ................ G01C 19/62 73/504.05 |
| 2015/0192532 | A1 | 7/2015 | Clevenson et al. |
| 2015/0268373 | A1 | 9/2015 | Meyer et al. |
| 2015/0316598 | A1 | 11/2015 | Rogge et al. |
| 2016/0161429 | A1* | 6/2016 | Englund ............ G01N 21/6402 324/304 |
| 2016/0334474 | A1 | 11/2016 | Hatano et al. |
| 2017/0370979 | A1 | 12/2017 | Braje et al. |
| 2018/0136291 | A1 | 5/2018 | Pham et al. |
| 2019/0178958 | A1 | 6/2019 | Barry et al. |
| 2019/0235031 | A1 | 8/2019 | Ibrahim et al. |
| 2020/0025835 | A1 | 1/2020 | Pham et al. |
| 2020/0064419 | A1 | 2/2020 | Barry et al. |

OTHER PUBLICATIONS

Acosta, V. M. et al., "Temperature Dependence of the Nitrogen-Vacancy Magnetic Resonance in Diamond," Physical Review Letters 104, pp. 070801-1-4 (Feb. 2010).
Aharonovich, I. et al., "Diamond Photonics," Nature Photonics, vol. 5, pp. 397-405 (Jul. 2011).
Arroyo-Camejo, S. et al., "Stimulated Emission Depletion Microscopy Resolves Individual Nitrogen Vacancy Centers in Diamond Nanocrystals," ACS Nano, vol. 7, No. 12, pp. 10912-10919 (2013).
Bar-Gill, N. et al., "Solid-state electronic spin coherence time approaching one second," Nature Communications, doi:10.1038/ncmms2771, https://www.naturecommunications.com, 6 pages (Apr. 2013).
Bar-Gill, N. et al., "Suppression of spin-bath dynamics for improved coherence of multi-spin-qubit systems," Nature Communications, doi:10.1038/ncomms1856, www.nature.com/naturecommunications.com, 6 pages (May 2012).
Bartels, B. et al., "Smooth optimal control with Floquet theory," http://arxiv.org/abs/1205.5142v2, 7 pages (Sep. 2013).
Chen, E. H. et al., "High-sensitivity, spin-based electrometry with an ensemble of nitrogen-vacancy centers in diamond," http://arXiv:1703.07517v1, 8 pages (Mar. 2017).
Chen, E. H. et al., "Wide-Field Multispectral Super-Resolution Imaging Using Spin-Dependent Fluorescence in Nanodiamonds," Nano Letters 13, pp. 1073-2077 (2013).
Doherty, M. W. et al., "Electronic Properties and Metrology Applications of the Diamond NV-Center under Pressure," Physical Review Letters, 112, pp. 047601-1-5 (Jan. 2014).
Doherty, M. W. et al., "Theory of the ground-state spin of the NV-center in diamond," Physical Review B, vol. 85, pp. 205203-1-21 (2012).
Dolde, F. et al., "Electrical field sensing using single diamond spins," Nature Physics, vol. 7, pp. 459-463 (Jun. 2011).
Dolde, F., "The nitrogen vacancy center in internal and external fields," Physikaliches Institut der Universitaat Stuttgart, 170 pages (Jul. 2014). [Parts 1 and 2].
Hegyi, A. et al., "Nanodiamond imaging: molecular imaging with optically-detected spin resonance of nitrogen-vacancy centers in nanodiamonds," Proc. of SPIE, vol. 8635 863506, http://proceedings.spiedigitallibrary.org, 8 pages (2013).
Hodges, J. S. et al., "Timekeeping with electron spin states in diamond," Physical Review, 87(3), 032118, 11 pages (2013).

Horowitz, V. R. et al., "Electron spin resonance of nitrogen-vacancy centers in optically trapped nanodiamonds," http://arXiv:1206.1573v1, 29 pages (Jun. 2012).
Igarashi, R. et al., "Real-Time Background-Free Selective Imaging of Fluorescent Nanodiamonds in Vivo," Nano Lett., 12, pp. 5726-5732 (2012).
International Search Report and Written Opinion dated Sep. 8, 2017 for International Application No. PCT/US2017/039715, 17 pages.
Jensen, K. et al., "Cavity-enhanced room-temperature magnetometry using absorption by nitrogen-vacancy centers in diamond," http://arXiv:1401.2438v1, 8 pages (Jan. 2014).
Kucsko, G. et al., "Nanometre-scale thermometry in a living cell," Nature, vol. 500, pp. 54-59 (Aug. 2013).
Le Sage, D. et al., "Efficient photon detection from color centers in a diamond optical waveguide," Physical Review B, vol. 85, 4 pages (2012).
Maletinsky, P. et al., "A robust scanning diamond sensor for nanoscale imaging with single nitrogen-vacancy centres," Nature Nanotechnology, doi:10.1038/nnano.2012.50, http://www.nature.com/naturenanotechnology, 5 pages (May 2012).
Mamin, H. J. et al., "Nanoscale Nuclear Magnetic Resonance with a Nitrogen-Vacancy Spin Sensor," Science, vol. 339, pp. 557-560 (Feb. 2013).
Maze, J. R. et al., "Nanoscale magnetic sensing with an individual electronic spin in diamond," Nature, vol. 455, pp. 5 pages (Oct. 2008).
Mcguinness, L. P. et al., "Quantum measurement and orientation tracking of fluorescent nanodiamonds inside living cells," Nature Nanotechnology, doi:10.1038/nnano.2011.64, http://www.nature.com/naturenanotechnology, 6 pages (Jun. 2011).
Nusran, N. M. et al., "Dual-channel lock-in magnetometer with a single spin in diamond," http://arXiv:1309.1911v4, 9 pages (Jul. 2014).
Nusran, N. M. et al., "High-dynamic-range magnetometry with a single electronicspin in diamond," Nature Nanotechnology, doi.org/10.1038/nnano.2011.225], 6 pages, published online Dec. 18, 2011; corrected online Jan. 13, 2012.
Pham, L. M. et al., "Magnetic field imaging with nitrogen-vacancy ensembles," New Journal of Physics 13, 045021, 15 pages (2011).
Pham, L. M., "Magnetic Field Sensing with Nitrogen-Vacancy Color Centers in Diamond," Dissertation presented to The School of Engineering and Applied Sciences in partial fulfillment of the requirements for the degree of Doctor of Philosophy in the subject of Applied Physics Harvard University, Cambridge, Massachusetts, 136 pages (May 2013).
Rittweger, E. et al., "STED microscopy reveals crystal colour centres with nanometric resolution," Nature Photonics, vol. 3, pp. 144-147 (Mar. 2009).
Rondin, L. et al., "Magnetometry with nitrogen-vacancy defects in diamond," Rep. Prog. Phys. 77, 056503, 26 pages (2014).
Schirhagl, R. et al., "Nitrogen-Vacancy Centers in Diamond: Nanoscale Sensors for Physics and Biology," Annu. Rev. Phys. Chem. 65, pp. 83-105 (2014).
Sharma, S. et al., "Diamond-based field sensor for nEDM experiment," Proc. of SPIE, vol. 9755 97552U-1, http://proceedings.spiedigitallibrary.org, 10 pages (May 2017).
Sharma, S. et al., "Stark Shifts Measurements in NV Ensembles," Department of Physics, University of Illinois, Urbana, IL, Southwest Sciences Ohio Operations, Cincinnati, OH, Texas A&M University, College Station, TX, 5 pages (Aug. 2016).
Shin, C. S. et al., "Room-temperature operation of a radiofrequency diamond magnetometer near the shot-noise limit," Journal of Applied Physics 112, pp. 124519, 11 pages (2012).
Staudacher, T. et al., "Nuclear Magnetic Resonance Spectroscopy on a (5-Nanometer)3 Sample Volume," Science, vol. 339, pp. 561-563 (Feb. 2013).
Steinert, S. et al., "Magnetic spin imaging under ambient conditions with sub-cellular resolution," Nature Communications, doi:10.1038/ncomms2588, http://www.nature.com/naturecommunications, 6 pages (Mar. 2013).
Stoupin, S. et al., "Ultraprecise studies of the thermal expansion coefficient of diamond using backscattering x-ray diffraction," Physical Review B, vol. 83, pp. 104102-1-7 (2011).

(56) References Cited

OTHER PUBLICATIONS

Taylor, J. M. et al., "High-sensitivity diamond magnetometer with nanoscale resolution," http://arxiv.org/abs/0805.1367v1, 29 pages (May 2008).

Toylia, D. M. et al., "Fluorescence thermometry enhanced by the quantum coherence of single spins in diamond," PNAS, vol. 110, No. 21, pp. 8417-8421 (May 2013).

Van Oort, E. et al., "Cross-relaxation dynamics of optically excited N-V centers in diamond," Physical Review B, vol. 40, No. 10, pp. 6509-6517 (Oct. 1989).

Weidner, D. J. et al., "Strength of Diamond," Science, vol. 266, pp. 419-422 (Oct. 1994).

Yang, X. et al., "STED imaging of Nitrogen-Vacancy Centers in Diamond," Proc. of SPIE, vol. 8845, http://proceedings.spiedigitallibrary.org, 5 pages (Apr. 2014).

Zhang, W. et al., "Fiber Bragg grating pressure sensor with ultrahigh sensitivity and reduced temperature sensitivity," Optical Engineering, vol. 48, No. 2, pp. 024402-1-4 (Feb. 2009).

\* cited by examiner

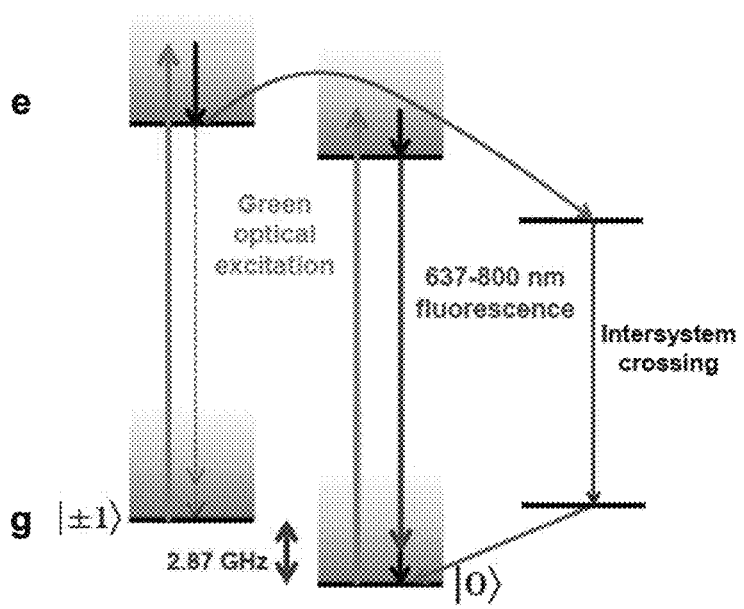
FIG. 2A
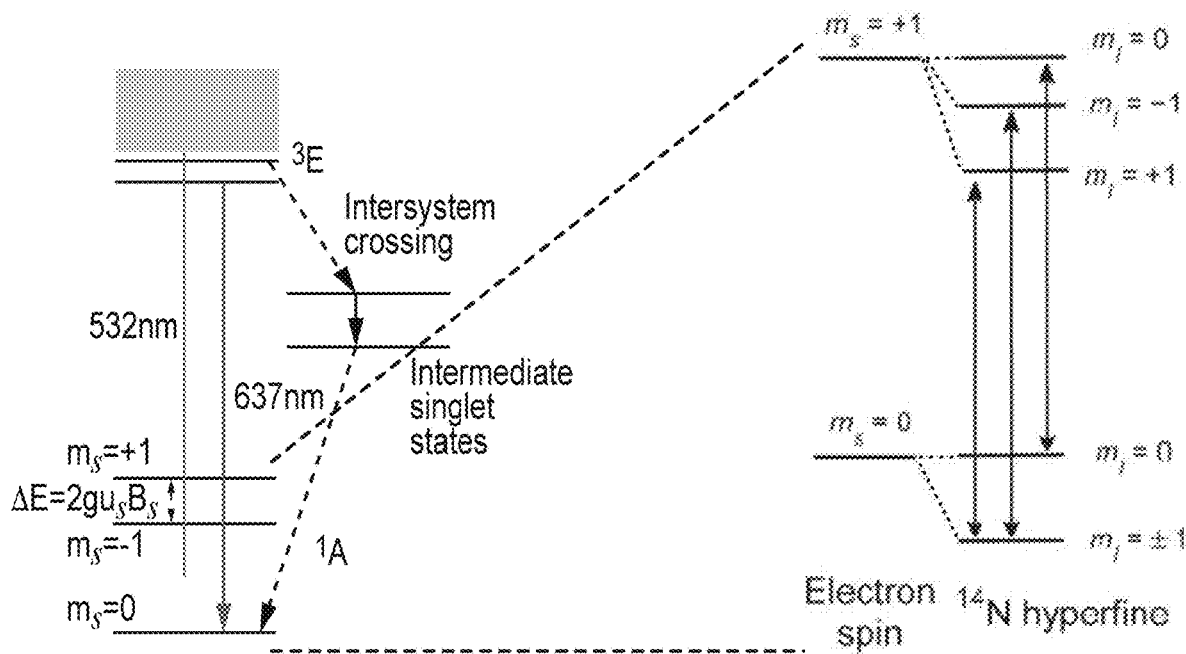
FIG. 2B             FIG. 2C

Ground state Lock-in @ 0 Gauss field

Results @ 0G transverse, Excited State

FIG. 15A
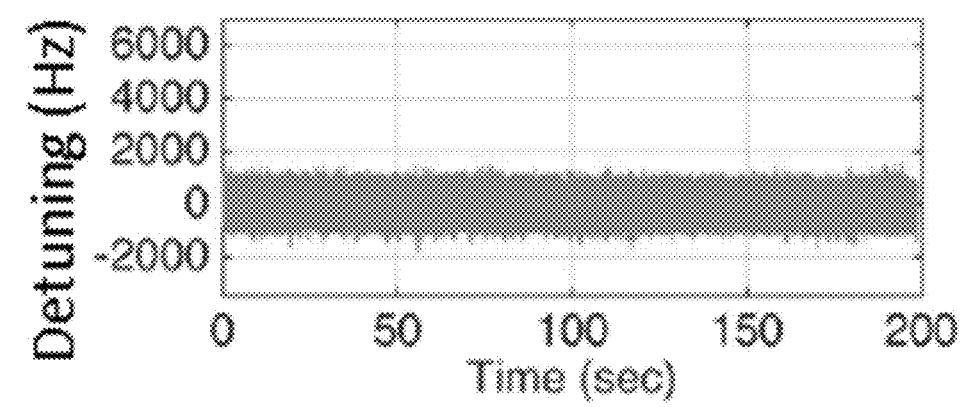
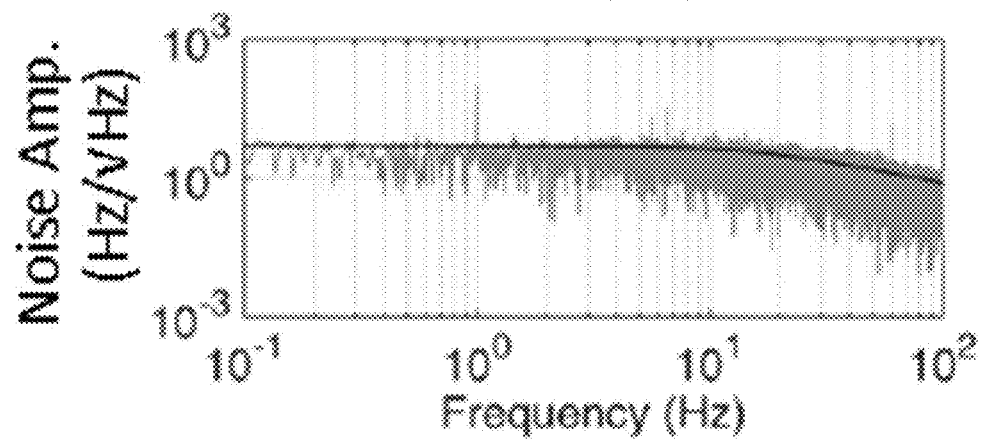
FIG. 15B

FIG. 16A
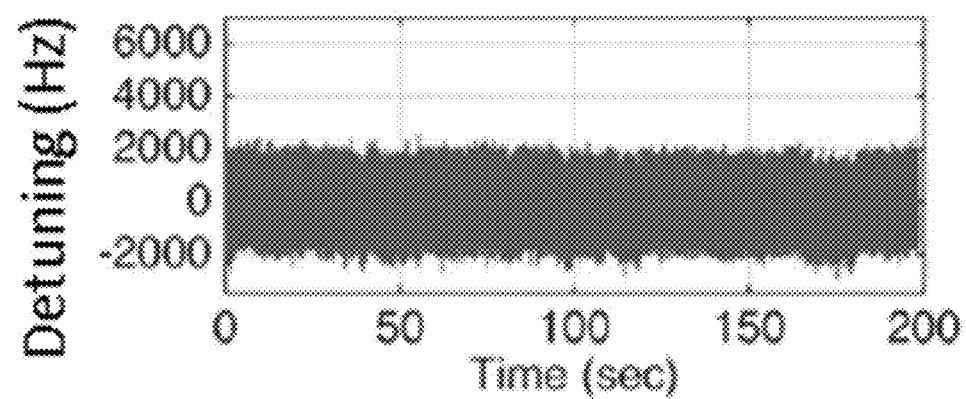
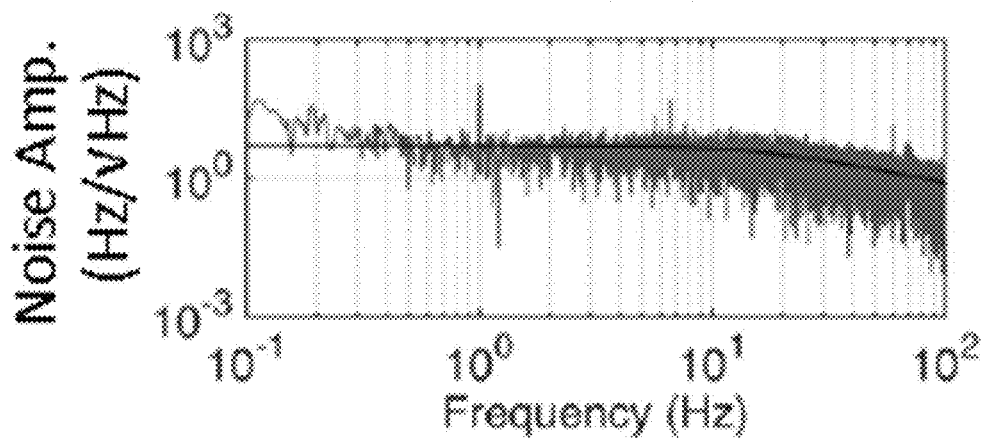
FIG. 16B

Corresponds to a shift of $10^3$ V/cm
Sensitivity ~ 300 V/cm/√Hz

SPIN-BASED ELECTROMETRY WITH SOLID-STATE DEFECTS

CROSS-REFERENCE TO RELATED APPLICATION(S)

This application is a continuation of U.S. application Ser. No. 15/635,852, filed on Jun. 28, 2017, which in turn claims the priority benefit, under 35 U.S.C. 119(e), of U.S. Application No. 62/355,448, filed on Jun. 28, 2016. Each of these applications is incorporated herein by reference in its entirety.

GOVERNMENT SUPPORT

This invention was made with Government support under Contract Nos. FA8721-05-C-0002 and FA8702-15-D-0001 awarded by the U.S. Air Force. The Government has certain rights in the invention.

BACKGROUND

The development of electric field sensors, or electrometers, for detecting low-frequency and weak signals with high spatial resolution is useful for areas of research ranging from particle physics and atmospheric sciences to electronic diagnostics and neuroscience. Commonly available electrometers that rely on electrostatic induction include field mills and dipole antennas. They are physically limited in size by the wavelength of the electric field of interest thereby limiting the possibility of miniaturization at lower frequencies. Recent work towards the development of miniaturized electrometers include utilizing the electro-optic effect within solid-state crystals within one arm of a fiber-based Mach-Zehnder interferometer or the electric-field induced shifts of atom-based sensors, such as trapped ions or Rydberg atoms. However, such miniaturized sensors typically suffer from narrow detection bandwidths and require large peripheral equipment.

Previous demonstrations of electric-field sensing with a single nitrogen vacancy (NV) under ambient conditions yielded sensitivities of 891±21 V cm$^{-1}$ Hz$^{-1/2}$ (DC) and 202±6 V cm$^{-1}$ Hz$^{-1/2}$ (AC). Although a single NV was used to detect the charge-state of a neighboring NV, the noise properties of the charge-state fluctuations of the NV remains an active area of investigation.

SUMMARY

Embodiments of the present invention include methods and apparatus for measuring electric fields. An example electrometer comprises a solid-state host having an ensemble of color centers, a magnetic field generator in electromagnetic communication with the ensemble of color centers, a detector in optical communication with the solid-state host, and a processor operably coupled to the detector. In operation, the magnetic field generator applies a zero-bias magnetic field to the ensemble of color centers. The detector measures an optically detected magnetic resonance (ODMR) spectrum of the ensemble of color centers while the ensemble of color centers is subject to the zero-bias magnetic field. This ODMR spectrum indicates a shift in a frequency of a ground state and/or an excited state of the ensemble of color centers caused by an electric field. And the processor estimates a magnitude of the electric field based on the ODMR spectrum.

There may be at least 10$^{10}$ color centers in the ensemble of color centers.

The magnetic field generator may be configured to cancel an ambient magnetic field, including the Earth's magnetic field.

The electrometer may further include a light source in optical communication with the solid-state host and a microwave source in electromagnetic communication with the solid-state host. The light source illuminates the ensemble of color centers with light selected to spin polarize the ensemble of color centers. And the microwave source applies a microwave to the ensemble of color centers. In some cases, the electrometer also includes a stripline, bonded to the solid-state host and in electrical communication with the microwave source, to guide the microwave.

The processor may estimate a shift in the frequency of the ground state of the ensemble of color centers caused by a change in temperature of the ensemble of color centers. It may estimate the magnitude of the electric field over a frequency range of 0 Hz to 100 Hz with a shot-nose limited sensitivity of 1 V/cm √Hz. It may estimate a direction of the electric field based on the ODMR spectrum. And it may estimate a noise spectral density of electric field fluctuations within the solid-state host based on the ODMR spectrum.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 2A shows a transition of an example NV center from the ground state to an excited state and back through radiative and non-radiative pathways to illustrate spin polarization.

FIG. 2B shows example state transitions with labelled spin states.

FIG. 2C shows example spin states at the ground state including hyperfine states.

FIG. 15A shows a time trace from channel 1 of a lock-in amplifier (corresponding to measurement of strain at zero electric field on the hyperfine 0-sensing transition).

FIG. 15B is a plot of noise spectral density for the time trace of FIG. 15A.

FIG. 16A shows a time trace from channel 2 of the lock-in amplifier of FIG. 15A (corresponding to measurement of strain on the hyperfine 0+ transition).

FIG. 16B is a plot of noise spectral density for the time trace of FIG. 16A.

DETAILED DESCRIPTION

Introduction

Electric field sensors, or electrometers, for detecting weak, low-frequency signals with high spatial resolution have a wide range of applications, from particle physics and atmospheric sciences to electronic diagnostics and neuroscience. Commonly available electrometers rely on electrostatic induction and are physically limited in size by the wavelength of the electric field they can sense. Methods and apparatus for electric field sensing based on the spin state of solid-state defects (for example, nitrogen vacancy (NV) centers or NVs), lend themselves to miniaturization to address this requirement. Other advantages of using solid state defects for local electric/strain field sensing include the ability to place the electrometer with precision at the desired spatial location, to precisely control the size of the electrometer to measure an appropriately sized (localized) field, and to less-invasively measure field experienced by a sample. Additional advantages of using optically active solid state defects like NVs include remote detection of electric fields in both hostile and delicate environments and no need to calibrate the applied microwave frequencies.

Without being bound or limited by any particular theory, this application discloses a theory of operation and example variations of methods and apparatus for measuring and quantifying transitions between hyperfine states (sensitive to electric strain fields) of an ensemble of nitrogen vacancy centers (NVs). It includes example experimental measurements to determine the magnitude (and/or direction) of an external electric field under ambient temperature and zero-bias magnetic field.

Specifically, in example experiments, measuring based on an ensemble of NVs results in better sensitivity (up to 1 V cm$^{-1}$ Hz$^{-1/2}$ even for DC fields compared to 891±21 V cm$^{-1}$ Hz$^{-1/2}$ (DC) from previous measurements using single NVs. The zeroing of ambient magnetic field also results in increased sensitivity. The ability to sense weak electric fields at ambient temperature using these methods and apparatuses vastly increases the range of applicability to include, for example, electric field sensing in biological samples. Additionally, the technology presented here can also account for fluctuations in temperature in the measurements by registering a baseline measurement or by independently measuring temperature fluctuations to improve electric field sensitivity. The following sections and the associated figures provide detailed description of examples methods and the apparatus of using ensembles of NVs or other color centers under zero-bias magnetic field to make sensitive electric-field and/or strain measurements.

Theory

Nitrogen Vacancies

Figure 1A:
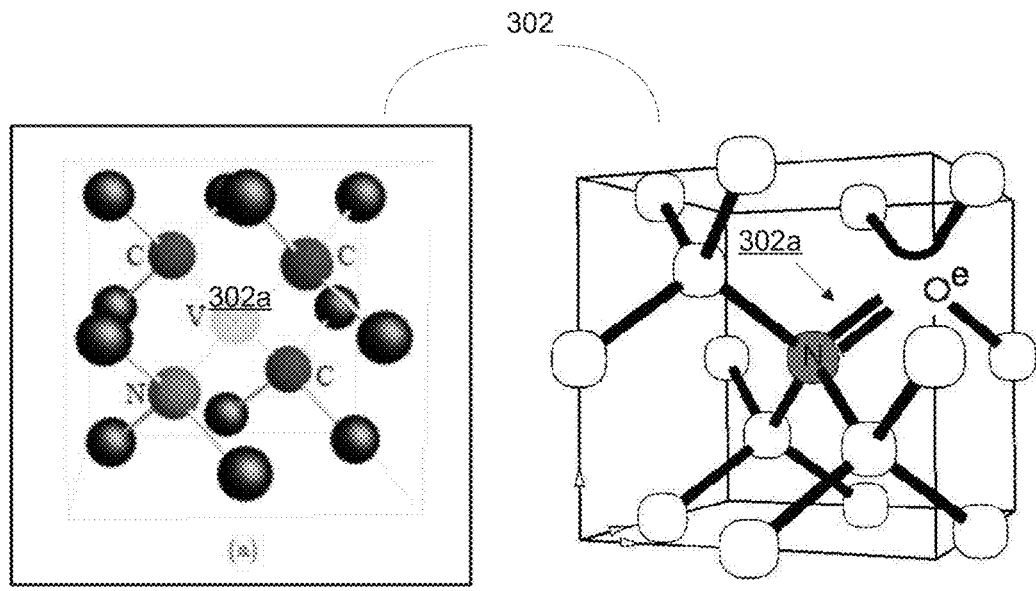
FIG. 1A shows an example nitrogen vacancy center.

A crystalline solid has a crystal structure with repeating units of atoms or molecules over lattice points. When this arrangement is imperfect, there can be point defects that occur in the crystal structure at certain lattice points. Types of point defects in crystal hosts include vacancy defects where lattice points are left vacant resulting in a redistribution of charge densities and other properties associated with the lattice members. For example, the crystal host can be a bulk diamond host containing nitrogen vacancy (NV) centers as illustrated in FIG. 1A. The NV center 302a shown along the crystal direction in the diamond host 302 comprises a substitutional nitrogen atom (N) in a lattice site adjacent to a carbon vacancy V. The carbon atoms surrounding the NV center are labelled C. The NV center may have at least four orientations corresponding to the location of the substitutional nitrogen atom with respect to the vacancy center V. A collection of NV centers, such as the NV 302a, within the bulk diamond host 302 is referred to as an ensemble of NV centers and can be used to measure the magnitude and/or direction of magnetic, electric, and strain fields applied to the diamond host 302.

NV centers can exist in a charged state NV$^-$ (or referred to simply as NV) or a neutral state NV$^0$. An NV center in the charged state has an additional electron: in addition to the five dangling bond electrons, one each from the carbon atoms and one pair of electrons between the vacancy and the nitrogen atom. NV$^-$ and NV$^0$ can be optically distinguished by their ZPLs (zero phonon line) at 637 nm and 575 nm, respectively.

NVs have a ground state, which is a spin triplet with three spin sublevels. The spin triplet has one spin state $m_s=0$ and two spin states $m_s=+1$ and $m_s=-1$ as shown in the example in FIG. 1B. With no external magnetic field, the $m_s=\pm 1$ energy levels are offset from the $m_s=0$ level and the $m_s=\pm 1$ levels are degenerate. Under a non-zero magnetic field, the $m_s=\pm 1$ levels are no longer degenerate as shown in the inset in the energy level diagram in FIG. 1B. Individual NVs can transition from the $m_s=0$ spin state to the $m_s=\pm 1$ state by absorbing microwave radiation of the frequency corresponding to the difference between the two states.

Figure 1B:
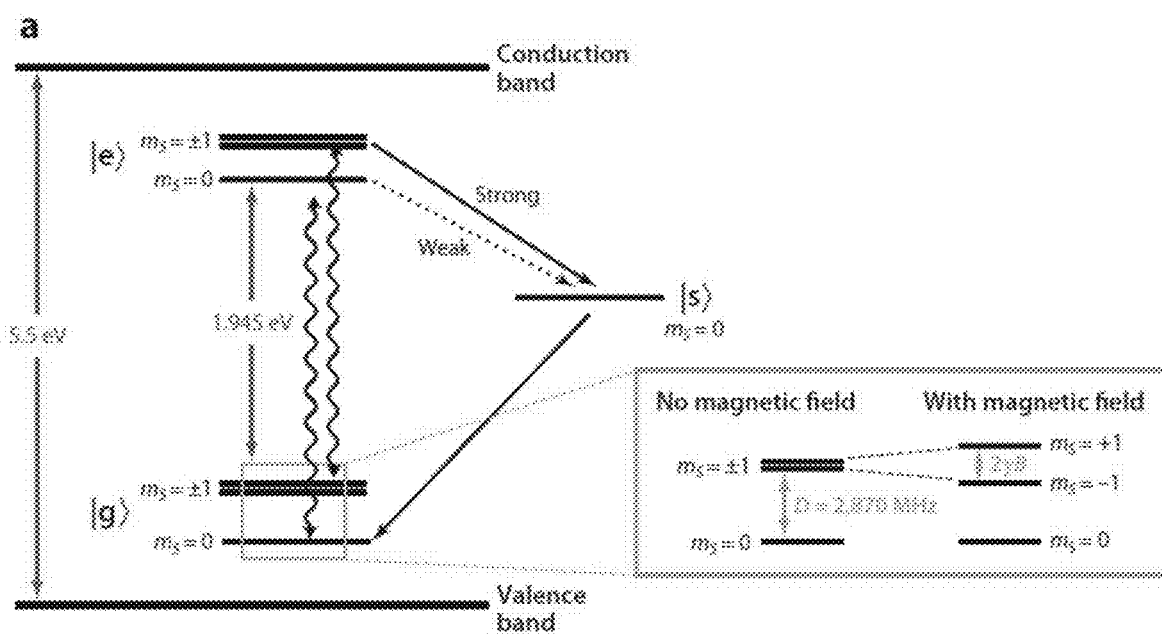
FIG. 1B depicts a generalized energy level diagram as an example showing the state transitions of an exemplary NV center.

NVs can also have an excited triplet state (e) as shown in FIG. 1B, including three spin sub-levels or fine structure levels $m_s=0$ and $m_s=+1$ and $m_s=-1$. NVs can directly transition from the ground state g to the excited state e or vice versa, indicated by the squiggly arrows in FIG. 1B, while retaining their spin state. The transition from the excited state to the ground state can be effected by emitting a photon whose energy corresponds to the energy gap between the energy levels of the transition, for the zero phonon line, or the energy gap minus the energy of a phonon in the case of the phonon sidebands.

Some NVs may transition from the excited state e to the ground state g via intermediate states s containing a (singlet) spin state $m_s=0$, as depicted in FIG. 1B. This alternative path involves little to no photon emission, being mostly non-radiative, and largely decays to the $m_s=0$ spin level of the ground state. Further, the fine structure levels $m_s=\pm 1$ in the excited state can have a higher likelihood of taking the non-radiative path over the level $m_s=0$ in the excited state, as indicated by the solid and dotted arrows in FIG. 1B.

Due to the higher likelihood of the transition from excited $m_s=\pm 1$ via the non-radiative path, the intensity of optical emission can be used to determine the spin state of one or more NVs. That is, the more NVs in the $m_s=\pm 1$ instead of the $m_s=0$ state, the lower the average fluorescence intensity. Optically detected magnetic resonance (ODMR) can be used to report the spin state of NVs from the fluorescence (ODMR) spectrum.

Optical stimulation of NV centers can cause the transition of a subset of the NVs from the ground state to the excited state. FIG. 2A shows a schematic of the energy level diagram when an exemplary NV is optically excited to transition from the ground (triplet) state A to the excited triplet state E, using excitation light of 532 nm. Such a state transition mediated by optical excitation can allow the NVs to decay back to the ground state by emitting light, for example, by emitting light of wavelength >637 nm, as shown in FIG. 2B. NVs can also decay back to the ground $m_s=0$ spin state via a predominantly non-radiative path that involves no light emission, as discussed above. The path taken can depend on the spin state of the individual NVs upon excitation. The decay back to ground state is largely to the $m_s=0$ spin state, thereby enriching the population of NVs in the ground state with spin $m_s=0$.

The NVs in ground state or the excited state can further transition between multiple energy levels defined by their hyperfine structure. For example, NVs in the ground or excited state $m_s=0$ electron spin state can further transition to one of four hyperfine states of the $m_s=\pm 1$ electron spin states, $m_i=+1, +0, -0,$ and $-1$ in descending order of energy. The ground state energy levels corresponding to the hyperfine manifolds of an example NV center are shown in FIG. 2C. These fine structure transitions are driven by absorbing microwave radiation of the frequency corresponding to the energy difference between the two states. The spins return to the $m_s=0$ spin state through radiative and non-radiative pathways. In the case of optical pumping, return to the $m_s=0$ state with the non-radiative pathways can result in reduced emitted photoluminescence and is therefore indicated by transient decreases in the fluorescence intensity as read by an ODMR spectrum, as discussed below.

Sensitivity to Electric Field

The physical origin of the NV's sensitivity to electric field comes from the NV's optical excited state configuration, which is a molecular doublet ($^3E$) and is highly sensitive to electric fields according to the Stark effect. Briefly, the presence of electric field induces a shift in the spectral lines emitted by the NV center in response to state transitions. But the effect cannot be measured optically in ambient conditions due to phonon-induced mixing. Within each orbital of the molecular doublet, however, the electric-field induced splitting of a hyperfine manifold ($m_i=0$) can be detected by utilizing the magnetic spin-dependent fluorescence. Additionally, the highly electric-field sensitive $^3E$ orbital mixes with the ground-state molecular orbital ($^3A_2$) thereby inducing electric-field sensitivity for the ground state spin configuration of the NV centers.

The effect of electric field on the NVs in a bulk diamond host can result in a shift in the spin-dependent fluorescence (ODMR) spectrum. Due to the effect of electric/strain fields, the signature decrease in the photoluminescence signal from transitions associated with the hyperfine states $+0$ and $-0$ can undergo characteristic shifts. These electric/strain field induced shifts in the ODMR spectrum are known as detuning shifts can be simulated by building a numerical model of NVs.

Figure 3:
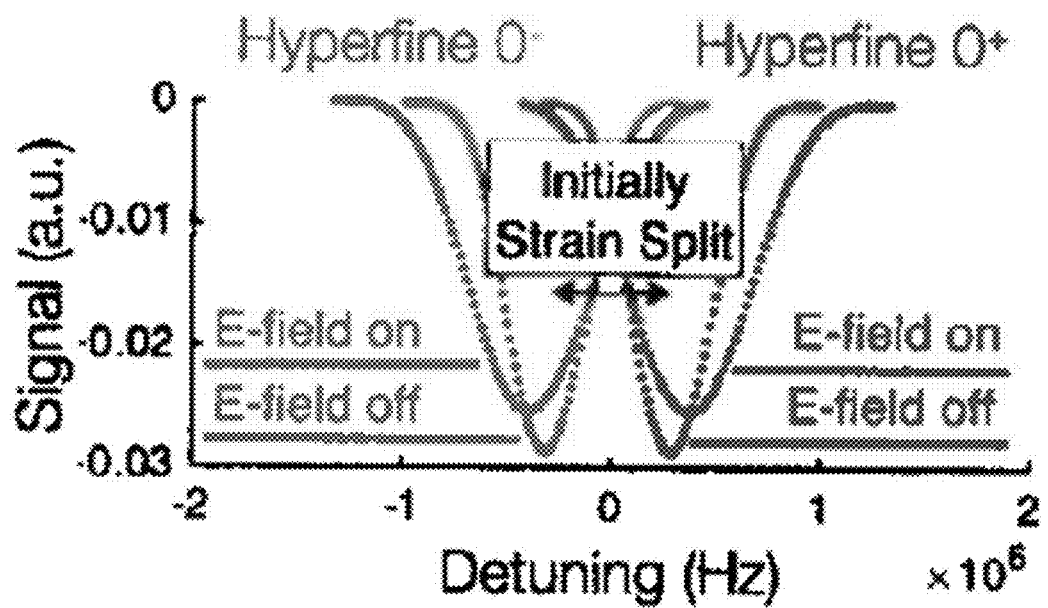
FIG. 3 shows an example numerical simulation of the effects of electric field on an optically detected magnetic resonance (ODMR) spectrum resulting from spin state transitions of hyperfine manifolds of an NV center.

The ODMR results from an example numerical simulation of an ensemble of NVs is shown in FIG. 3. Specifically, FIG. 3 shows the ODMR spectrum signal associated with the transitions to hyperfine states $m_i=-0$ and $+0$. The ODMR spectra obtained in the presence (E-field on) and absence (E-field off) of a switchable electric field are overlaid. As indicated, in the presence of electric field, the point of decrease in emitted fluorescence shifts to a difference MW frequency corresponding to a shift in energy level of the hyperfine state.

As shown, the signal associated with the hyperfine state $m_i=-0$ shifts in the opposite direction in terms of frequency from the shift in signal associated with the hyperfine state $m_i=+0$. In other words, the presence of electric field leads to a change in the splitting of the energy levels associated with hyperfine states thereby resulting in widening of the fluorescence peak associated with the transitions between the hyperfine states $m_i=\pm 0$ and the ground state $m_s=0$.

Figure 4A:
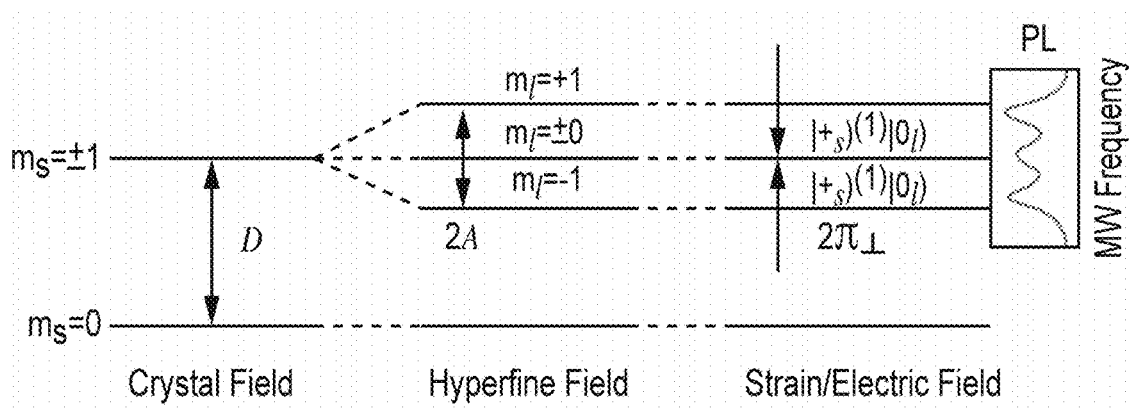
FIG. 4A shows a generalized energy level diagram for an example NV center indicating the spin states in the ground state and the contributions of electric and strain fields and changes in the ODMR spectrum from fine structure transitions (plot at right).
Figure 4B:
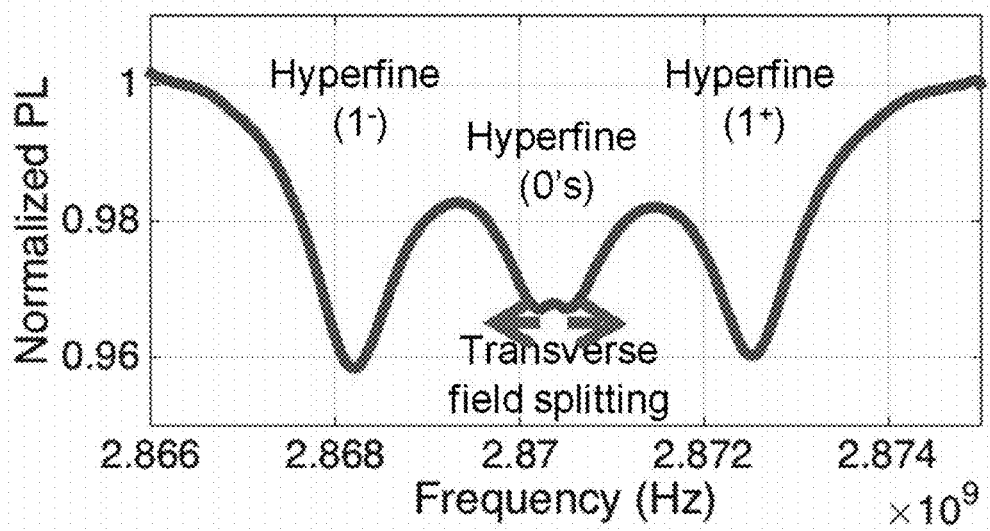
FIG. 4B shows an ODMR spectrum from hyperfine structure transitions indicating changes in the splitting induced by a transverse electric field.

FIG. 4A shows a generalized energy level diagram depicting how crystal (D), hyperfine (A), strain and electric fields (HI) can affect energy splitting in the ground state spin configurations of NVs in some embodiments of the present invention. The plot at right in FIG. 4A shows the ground-state ODMR spectra of an example ensemble of NVs. This is shown magnified in FIG. 4B indicating the field splitting due to transverse electric field from an ensemble of NVs in the ground state (under a zero-bias (0 G) magnetic field) measured using one example of the apparatus presented in this application.

Zeroing the ambient magnetic field allows more precise measurement of the electric field or strain field of interest. This is because zeroing the ambient magnetic field negates the effects of the magnetic field on the NV hyperfine transitions. This isolates the effect of the electric field from possible effects from the interplay between the electric fields and the magnetic field due to Zeeman Effect, as shown below in equation (1), which gives the form of the Hamiltonian describing the optical ground and excited states of an NV:

$$\hat{H}_{NV} \propto (D+d_\parallel)\hat{S}_z^2 + \underline{B}\cdot\underline{\hat{g}}\cdot\underline{\hat{S}} + \underline{\hat{S}}\cdot\underline{\hat{A}}\cdot\underline{\hat{I}} \quad (1)$$

where D is the crystal field splitting, $d_\parallel$ is the axial electric-field dipole moment, $\underline{B}$ the magnetic field vector, $\underline{S}$ the spin-1 Pauli operators, and $\underline{A}$ the hyperfine tensor. Since the electric-field effect on the NV spin is significantly smaller than the natural crystal field splitting, the electric-field dependence can be described as a perturbation to the Hamiltonian:

$$\hat{V} \propto d_\perp [\Pi_x(\hat{S}_x\hat{S}_y + \hat{S}_y\hat{S}_x) + \Pi_y(\hat{S}_x^2 - \hat{S}_y^2)] \quad (2)$$

where $d_\perp$ is the perpendicular electric-field dipole moment, $\Pi_x$ and $\Pi_y$ being the sum of the strain and electric fields at the NV.

In diagonalizing the Hamiltonians and using perturbation theory, one can derive the microwave transition frequencies between the eigenstates:

$$\omega_\pm(\vec{E}, \vec{B}) = D + k_z E_z + 3\frac{B_\perp^2}{2D} \pm \sqrt{B_z^2 + E_\perp^2 - \frac{1}{2}\sqrt{B_z^2 + E_\perp^2} \frac{B_\perp^2}{2D}\sin(\alpha)\cos(\beta) + \left(\frac{B_\perp^2}{2D}\right)^2} \quad (3)$$

where $\tan(\alpha) = E_\perp/B_{zy}$, $\beta = 2\phi_B + \phi_E$, $\tan(\phi_B) = B_y/B_x$, and $\tan(\phi_E) = E_y/E_x$.

The shot-noise sensitivity limits using an ensemble of 'n' NVs is given by the following:

$$E_{\perp,min} = \frac{\sigma_{f,min}}{d_\perp} \approx \frac{1}{d_\perp} \frac{1}{C\sqrt{n\gamma\tau}} \frac{1}{T_2^*} \quad (4)$$

where upon substituting experimentally feasible values, one can arrive at a shot-noise limit approaching $E_{\perp min} = 10^{-1}$ Vcm$^{-1}$ Hz$^{-1/2}$ for the ground state, and $E_{\perp min} = 10^1$ Vcm$^{-1}$ Hz$^{-1/2}$ for the excited state. Stronger microwave excitation increases the spin contrast of the excited state ODMR improves, possibly yielding closer sensitivities for the ground and excited states.

Electric/Strain Field Sensing

Methods of Sensing

Figure 5:
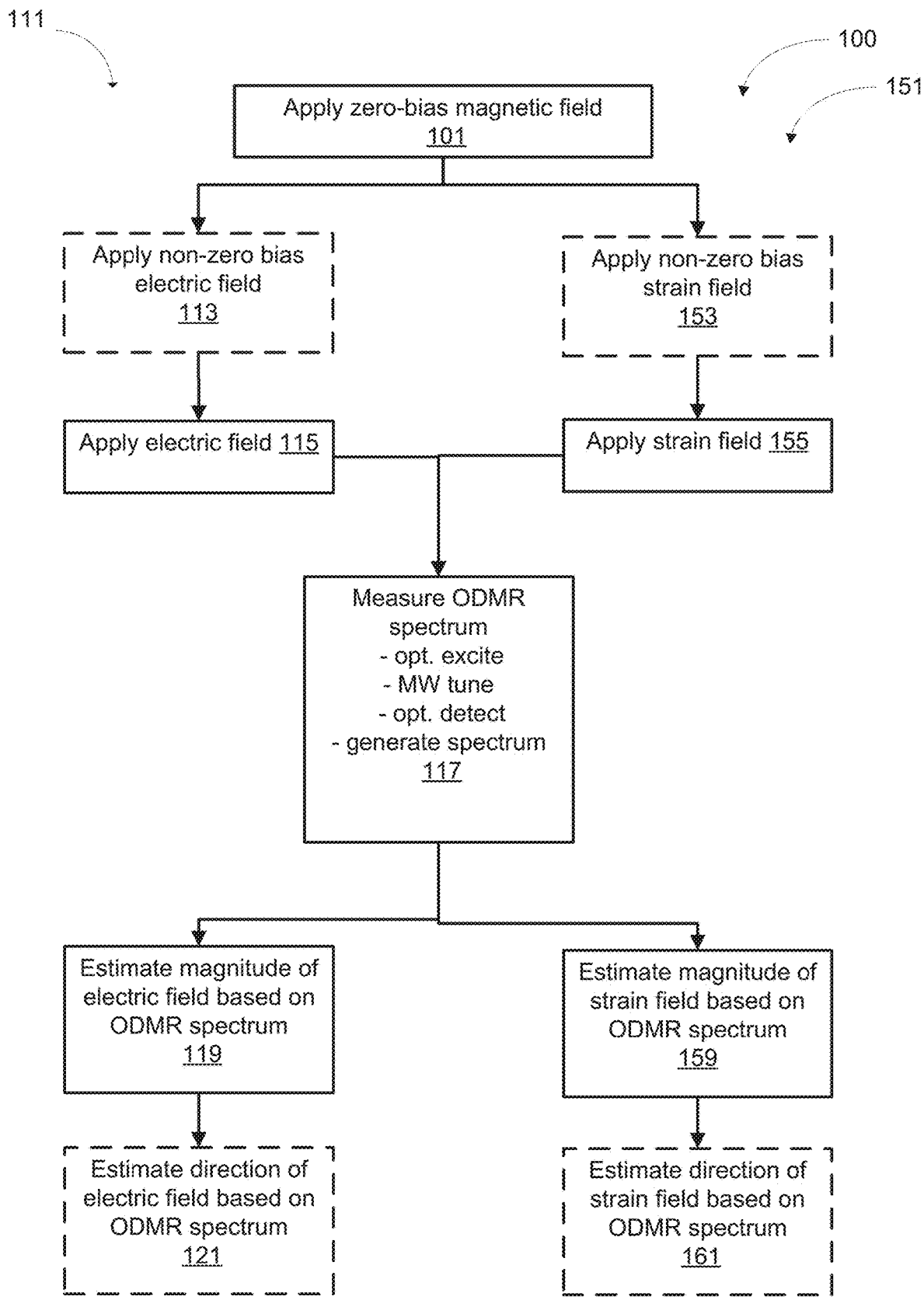
FIG. 5 shows an example flowchart of a method to measure electric/strain fields using an electrometer based on this spin state of an ensemble of solid-state defects.

FIG. 5 shows a process 100 of measuring an electric/strain field using a crystal host containing an ensemble of solid-state defects, for example, a bulk diamond host containing nitrogen vacancy (NV) centers as solid-state defects. The process 100 can be implemented to measure the local electric and strain fields experienced by the NV centers. This is shown by two process flow paths 111 and 151 in FIG. 5. If electric and strain fields are present simultaneously, they can be de-convolved by proceeding along both flow paths 111 and 151 simultaneously and/or sequentially for different bias field types (strain v. electric field), amplitudes, and orientations. For example, the steps shown in FIG. 5 may be combined and rearranged to: (1) apply bias strain field and measure the electric field along the bias strain field direction; (2) apply a bias strain field and measure the strain field along the bias strain field direction; (3) apply a bias electric field and measure the strain field along the bias electric field direction; and (4) apply a bias electric field and measure the electric field along the bias electric field direction. Other orders, combinations, and permutations are also possible.

Figure 6:
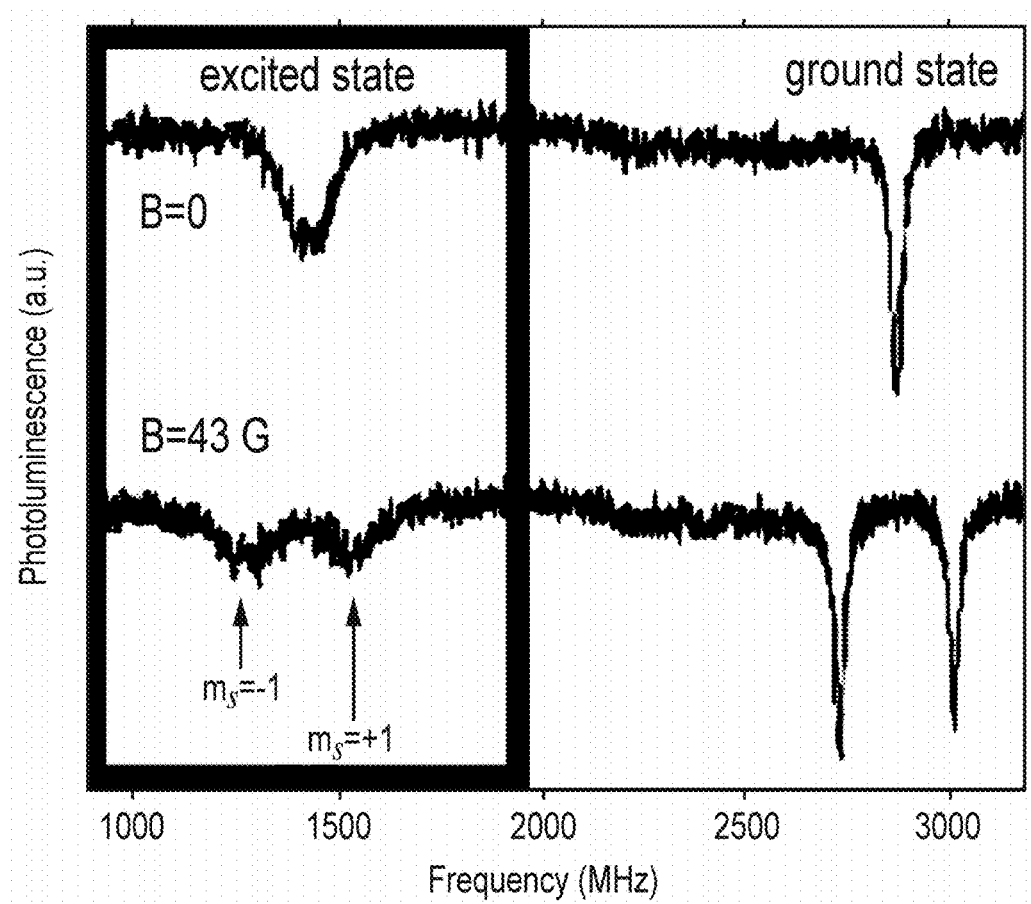
FIG. 6 shows ODMR spectra of a single NV center under a 0-Gauss magnetic field (upper trace) and a 43-Gauss magnetic field (lower trace). The left resonances are excited state and the right ones are the ground state.

In both flow paths, the process 100 includes a step 101 of applying a zero-bias magnetic field to the sample so as to zero the ambient magnetic field, including the Earth's magnetic field. Zeroing of the magnetic field can be carried out using changes in the ODMR spectrum associated with fine structure transitions as shown in FIG. 6. Magnetic fields of different orientations are applied to the sample with a magnetic field generator (e.g., Helmholtz coils) so as to reduce or minimize the ms=+/− splitting visible in the ODMR spectrum. The ensemble of NVs have eight crystallographic orientations, so the magnetic-field sensitive lines of all the NVs are minimized when there is no magnetic field in any direction.

As described above and shown in the upper trace of FIG. 6, under a zero-bias magnetic field, the spin states $m_s = \pm 1$ become degenerate resulting in a single fluorescence change associated with a single energy level. Thus, under a zero-bias magnetic field, any break in the degeneracy is due to another field, such as the applied electric or strain field. In contrast, a non-zero ambient magnetic field breaks this degeneracy, as shown in the lower trace of FIG. 6, which is for a net magnetic field of 43 Gauss. Having a magnetic field break the degeneracy makes it more difficult, if not impossible, to make sensitive measurements of the electric field or strain field experienced by the solid state defects in the crystal.

Zeroing of magnetic field can be carried out using gradient descent, using a custom built or commercially available digital lock-in amplifier (LIA). A custom-built LIA can incorporate an on-board processor (for example, a field programmable gate array (FPGA)) to perform both microwave (MW) waveform generation and lock-in detection for ODMR measurements (step 117, below). The MW waveform can be sent to the diamond upon being generated digitally in the FPGA by direct sampling with a high speed Digital-to-Analog Converter (DAC, running at 2.4 Gsamples/sec set by external clock feed in, in the 3rd Nyquist zone, direct synthesis). The digitally generated MW waveform can be just the raw waveform or can be suitable mixed or modulated as required to suit excitation of the desired crystal host with the desired solid-state defects.

For the measurement of local electric field following the flow path 111, the method 100 can also include an optional step 113 (indicated by the block within dotted lines) of applying a non-zero bias electric field to the sample, for example, by applying a voltage to electrodes in electrical communication with the sample. These electrodes can be formed by plating the host (e.g., diamond) on two sides with metal. The sides are chosen such that the electric field applied has equal projection onto all eight crystallographic orientations of NVs (e.g., as shown in FIG. 8B). The application of non-zero bias electric field can be used to determine the magnitude of the applied electric field and if the direction of the applied electric field matches the direction of the bias electric field.

The process 100 along path 111 include applying the electric field to be measured (step 115) if the electric field to be measured is not intrinsic to the material in which the diamond host is disposed. The electric field can be applied using any suitable technique. For example, the field can be applied by connecting electrodes made of a suitable conductive material to the crystal host and applying the electric field via the electrodes. Additionally, if particles embedded within the crystal host experience an intrinsic electric field, this intrinsic electric field can be measured too by comparing electric fields in different locations. This can be done by using a confocal microscope to study the entire diamond to determine the amount of intrinsic electric field local to each NV. Once this is accomplished, the diamond sample containing the entire NV ensemble can be used for bulk sensing of electric fields.

For the measurement of local strain field, the method 100 can follow the path 151 and includes an optional step 153 (indicated by the block within dotted lines) of applying a non-zero bias strain field to the sample, for example, using screws or piezo electric transducers. As long as pressure is exerted along the sample's strong crystal axis, it is possible to apply high strain to the sample without breaking the sample. (This is equivalent to applying a bias electric field to the NVs.) The application of a non-zero bias strain field can be used to determine the magnitude and if the direction of the measured strain field matches the bias strain field direction.

The path 151 includes applying the strain field (step 155), if the strain field to be measured is not intrinsic to the material in which the diamond host is disposed. The strain field can be applied using any suitable strain or force transferring mechanism, for example, screws or piezo electric transducers. For example, the field can be applied by using any deformation apparatus. Additionally, if particles embedded within the crystal host experience an intrinsic strain field, this intrinsic field can be measured too by comparing strains in different locations, e.g., using the confocal microscopy technique disclosed above.

Further, method 100 can include, as part of both flow paths 111 and 151, measuring the optically detected magnetic resonance (ODMR) spectrum of the sample (step 117). This ODMR spectrum shows how the hyperfine spin state transitions of the solid-state defects are affected by the electric field or strain field being measured. Step 117 can include sub-steps involved in measuring the ODMR of a sample. For example, step 117 can include illuminating the sample with excitation light, applying tuned microwave radiation to the sample, collecting photoluminescence emitted by the sample, processing the collected photoluminescence data, and generating an ODMR spectrum resulting from the data.

The optical excitation light can be of any suitable form to optically excite all the NV centers in the beam path. For example, the light can be of any suitable wavelength and any suitable pulse shape that can induce transitions of the spin triplet to the excited state E as discussed below.

Measuring the ODMR spectrum can include irradiating the sample containing the crystal host with microwave (MW) radiation in any suitable fashion so as to tune to the zero-splitting frequency of all the NV centers in the sample to measure, for example, by reducing or minimizing the fluorescence signal.

Measuring the ODMR spectrum can include collecting the photoluminescence and/or the fluorescence emitted by the NV centers using any suitable combination of optical and/or optoelectronic elements to gather data about the optical emission of the NV centers concurrent with MW irradiation and looking for effects that depend on the presence of both optical and MW radiation.

Measuring the ODMR spectrum in step 117 can also include processing the collected photoemission data concurrent with the MW radiation and generating a resulting ODMR spectrum plot as discussed below.

For electric field sensing, following flow path 111, the method 100 can further include a step 119 of analytically estimating the magnitude of electric field sensed by the sample containing the solid-state defects from the measured ODMR spectrum. The method 100 can further include an optional step 121 of estimating the direction of electric field in addition to the magnitude from step 119, for example, by comparing the measurements made with different defect orientations. The device is sensitive parallel to the direction of the bias electric/strain field, so it can be used to measure the magnitude of the applied field for different bias electric/strain directions to determine the orientation of the applied field.

The following table shows differences and similarities between expected electrometry from example calculations under zero magnetic field using the ground and excited states of the NV. It lists expected electric-field induced shift in the ensemble of spin-dependent fluorescence spectra.

| | Ground State | Excited State |
|---|---|---|
| Lande' g factor (g) | 2 | 2 |
| Lifetime ($T_1$) | milliseconds | nanoseconds |
| Crystal Field Splitting (D) | 2.8 GHz | 1.4 GHz |
| $N^{14}$ Hyperfine splitting (A) | 2 MHz | 40 MHz |
| Transverse field Sensitivity (d) | 17 Hz/(V/cm) | ~400 Hz/(~/cm) |

Similarly, to sense strain fields, following path 151, the method 100 can include step 159 of estimating the magnitude of strain field experienced by the NC centers and optionally step 161 of determining the direction of sensed strain field, for example, by comparing different defect orientations.

Apparatus for Sensing Electric/Strain Field

Figure 7:
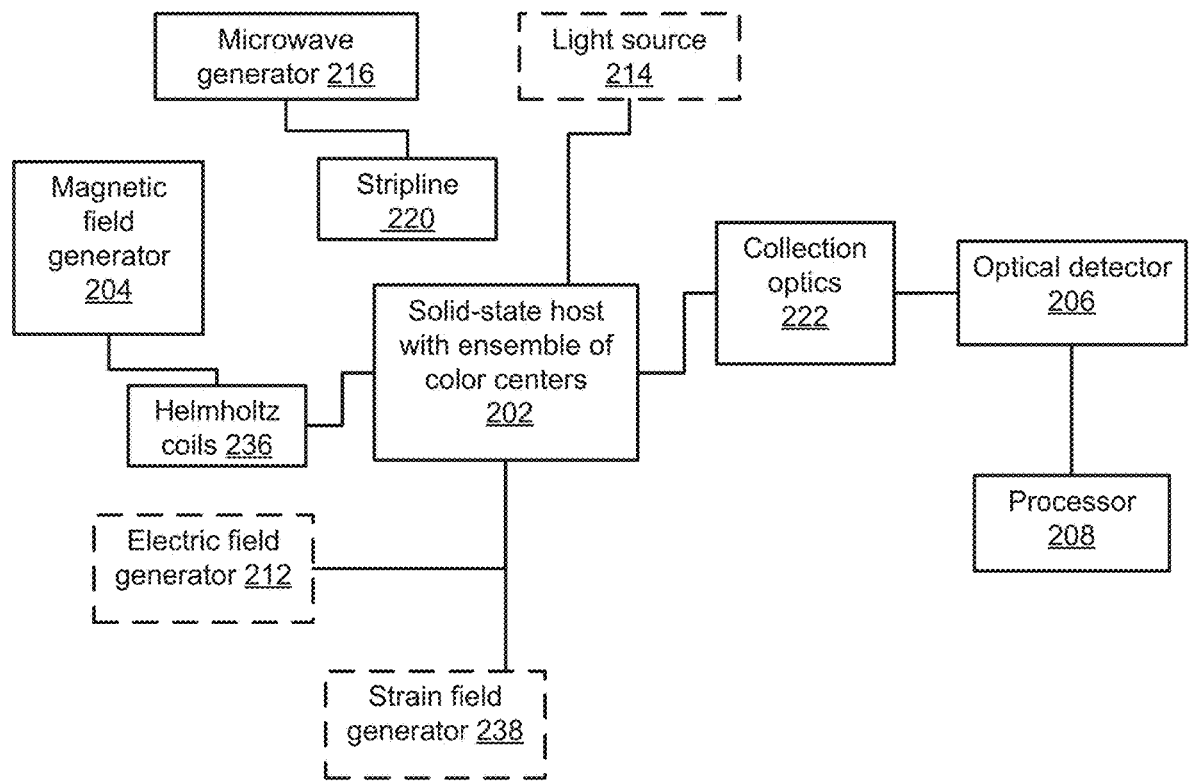
FIG. 7 shows an example block diagram of an apparatus used to measure electric/strain fields.

FIG. 7 shows a block diagram an apparatus 200 configured to sense electric field (or strain field) using the method 100 shown in FIG. 5. The apparatus 200 includes a solid-state host 202 containing an ensemble of color centers or solid-state defects (for example, nitrogen vacancy centers in a bulk diamond host). Other examples of solid-state defects include the ST1 center in diamond, the spin 3/2 center in silicon carbide, and spin-defects in the two-dimensional Van der Waals material hexagonal boron nitride. Newly discovered defects may also yield higher spin contrast, which can lead to faster readout speeds and higher sensitivity in units of the minimum detectable electric field per square root of bandwidth.

The apparatus 200 includes a magnetic field generator 204. The magnetic field generator 204 can be used to apply a zero-bias magnetic field, for example, using three-axis Helmholtz coils 236 to generate and deliver a uniform magnetic field to the host 202, as in step 101 in the process 100 of FIG. 5. The field generator 204 can provide a magnetic field of opposite sign and equal magnitude in order to zero the existing ambient magnetic field, for example, by reducing or minimizing the hyperfine $m_s=+/-1$ splitting. The field generator 204 can also include one or more suitable sensor(s) to measure the ambient magnetic field (including the Earth's magnetic field) experienced by the sample 202 containing the solid-state defects. The magnetic field generator 204 may include control systems and processors (e.g., processor 208) coupled to the sensors and Helmholtz coils 236 to provided appropriate feedback if desired.

The apparatus 200 can include a microwave generator 216 that applies microwave radiation tuned to the zero-field splitting frequency of the solid-state defects in the sample 202. The microwave source 216 can be connected to appropriate control systems and processors (e.g., processor 208) that control the process flow and operation of other associated parts in the assembly to provide smooth operation of the assembly. The microwave radiation may be applied through a stripline 220 or any other suitable structure, like a wire or an antenna, which may be electrically connected to the solid-state host 202 though patterning on a printed circuit board (PCB). The stripline 220 may also be patterned directly on the host 202. The stripline may be in any shape; for example, it can take the shape of the character "Omega."

The apparatus 200 can also include a light source 214 that simultaneously excites some, all, or substantially all of the solid-state defects in the host 202 (while also spin-polarizing to the ms=0 state). The light source 214 may be a laser or LED or filtered white light source that emits lights at any suitable wavelength. For example, the emitted light may be of wavelength 532 nm, which is optimal for NV centers. When using other solid-state defects, the light source may be chosen with appropriate wavelength, for example, if silicon vacancies in diamond are used a suitable light source that emits coherent light at a wavelength of about 737 nm may be chosen. The light source 214 can be operated in continuous wave or in pulsed mode. The light output may be modulated in properties like intensity, polarization, and phase and the light may be shaped spatially and/or routed following any suitable beam path using suitable optical elements such as mirrors and lenses to be directed onto the sample to be measured. The light source 214 may be connected to appropriate control systems and/or processors (e.g., processor 208) with or without feedback from the rest of the apparatus in order to generate the ODMR spectrum.

The apparatus 200 can also include an optical detector 206 and associated detection optics 222 for collecting light (fluorescence or photoluminescence) emitted by the solid-state defects in the sample 202. For example, the optical detector 206 may be a silicon photodetector. It can also be a photodiode or a photomultiplier tube or any other device that collects and transduces light to electrical signals. The collection optics 222 may include lenses placed before the detector 206 to ensure good signal collection. The collection optics can include light filters, for example, colored glass filters or dielectric filters that selectively pass or block light based on wavelength, to ensure that light of the desired wavelength—the wavelength corresponding to the photoluminescence emitted by the NV centers—is captured with minimal noise or background emission. Collection optics 222 may also include suitable reflectors and spatial filters to direct the collected light to the detector 206.

The apparatus 200 can also include an electric field generator 212 and/or a strain field generator 238 (e.g., screws or a piezo-electric element) to introduce compensatory electric and/or strain fields, for example, to reduce or minimize the 0+, 0− splitting as discussed above.

The apparatus 200 can also include a processor 208 that may be connected to the optical detector 206 and/or other components. For example, in addition to the optical detector the processor 208 can be connected to and control the light source 214, the microwave generator 216, and the magnetic field generator 204 for generating and analytically processing the ODMR spectrum. The same or similar processor can control the other elements of the apparatus 200. For example, one or more processors like 208 can be used to control the microwave generator 216, magnetic field generator 204, the light source 214, the optical detector 206, and the optional elements like the electric field generator 212. These processors may be operated to control the elements either together in an open-loop configuration, together in a closed-loop configuration, or individually.

Integrated Electric/Strain Field Sensor

Figure 8A:
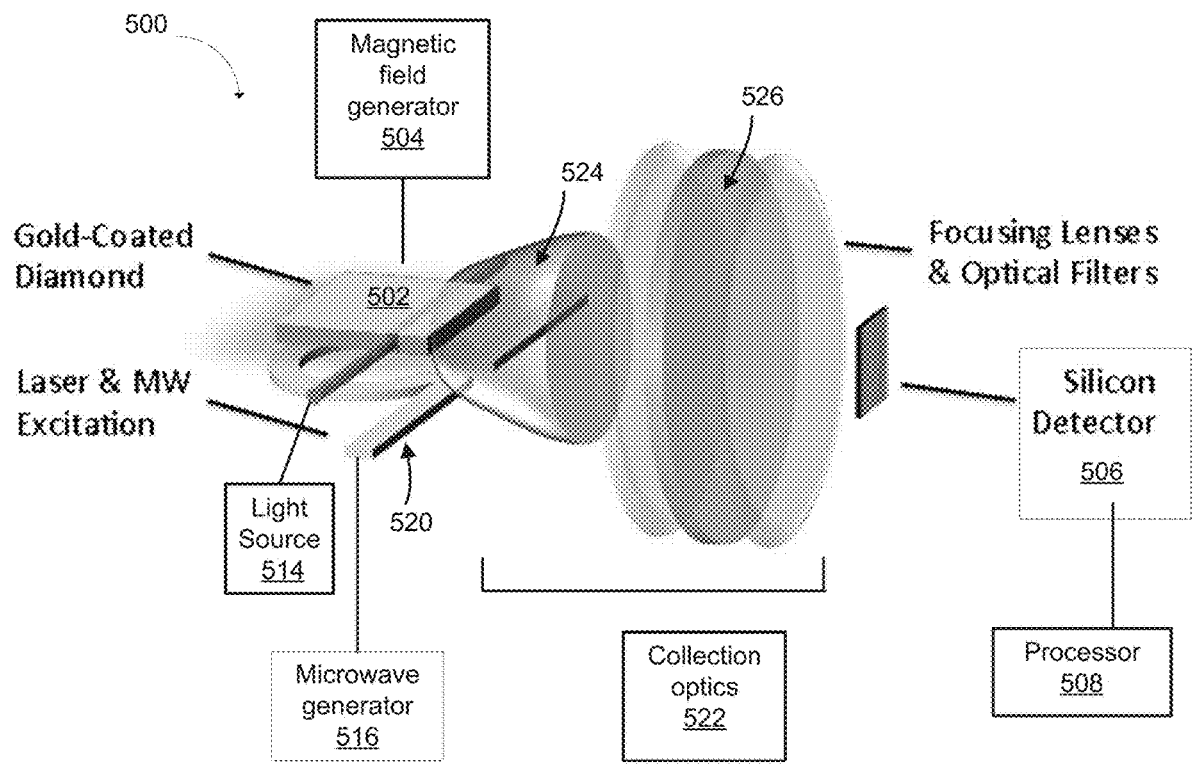
FIGS. 8A and 8B shows an example electric/strain sensing apparatus.
Figure 8B:
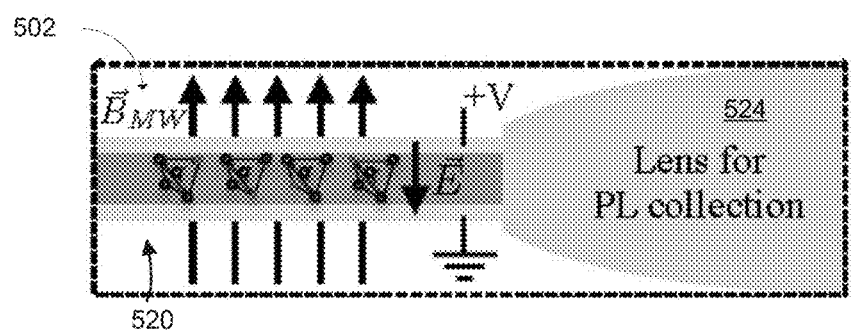

Some or all of the elements of the apparatus describe in FIG. 7 may be assembled in an integrated configuration 500 as shown in FIGS. 8A and 8B. For example, the bulk host can be a gold-coated diamond host 502 with an ensemble of NVs as shown in FIGS. 8A and 8B. The excitation laser source can be a 532 nm laser 514. A magnetic field generator 504, including magnetic field coils surrounding the host 502, applies a compensatory magnetic field so that the solid-state defects in the host 502 experience a zero-bias magnetic field. For example, the magnetic field generator 504 may include copper coils in parallel hoops surrounding the host 502.

Microwave radiation can be provided from a microwave generator 516 via a stripline 520 in the shape of the character "omega" close to the diamond host 502. The integrated assembly 500 can include light collection optics, including focusing lenses 524 and optical filters 526 that collect and filter light emitted by the ensemble of NVs in the crystal host 502 in response to MW and optical excitation during ODMR spectrum generation. The apparatus 500 can also include a photodetector 506 that transduces the collected light into an electrical signal, which can be recorded and processed during operation to produce an indication of the electric field or strain applied to the host 502. The detector 506 can in turn be connected to and controlled by a processor 508, which handles the operation of detector 506 and processes the data gathered by the 506 detector for further analysis, to generate an ODMR spectrum, for example.

Figure 9:
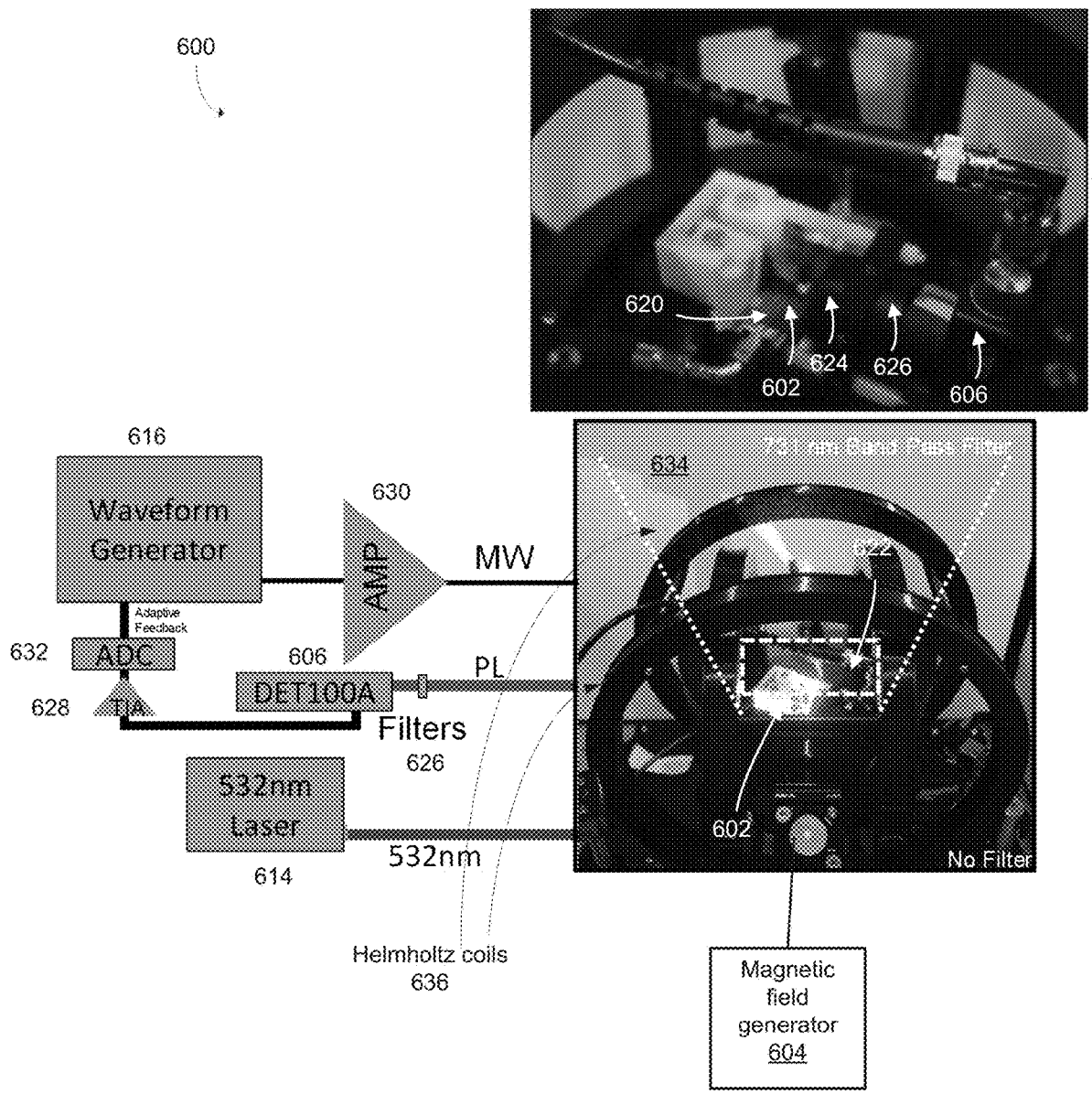
FIG. 9 shows another example assembly of the apparatus with some of the elements mounted on an optical table.

The elements of the apparatus describe in FIG. 7 may also be assembled in a laboratory configuration 600 as shown in FIG. 9. The assembly 600 can be similar in structure and/or function to any of the assemblies described herein, such as, for example, the assembly 200 shown in FIG. 7 and the integrated assembly 500 shown in FIG. 7. For example, the assembly 600 can include a crystal host 602 (shown in the photograph), a microwave generator (or a waveform generator) 616, a stripline 620 for delivery of microwave radiation, and a laser source 614 to excite the crystal at 532 nm. The assembly 600 can also include collection optics 622, including one or more collecting lenses 624 and one or more optical filters 626, and an optical detector 606. The crystal host 602 is surrounded by Helmholtz coils 636 that apply a magnetic field to the host 602 such that the solid-state defects in the host 602 are under a zero-bias magnetic field.

The assembly 600 can also include a transimpedance amplifier and lock-in amplifier 628 that receives the electrical signal from the optical detector 606. The assembly 600 can be configured such that the output of the amplifier is fed through an analog-to-digital converter (ADC) 632 into a waveform generator 616 to provide adaptive feedback, as shown in FIG. 9. The output of the waveform generator 616 may in turn be passed through an amplifier 630 and the resulting microwave radiation may applied to the crystal host 602 via the stripline 620. The assembly can be configured such that elements are mounted on an optical table 634. Elements mounted are shown in magnified view in the inset in FIG. 9.

Experimental Electric Field Measurements Under Zero-Bias Magnetic Field

One variation of the method discussed above for measuring electric field uses an ensemble of NVs with the applied electric field having an equal projection on all eight classes of NVs and without any magnetic field (0 G). In this method, one can calculate the expected electric-field induced shift in the ensemble of spin-dependent fluorescence spectra.

In one example implementation of the presented apparatus and methods, an ensemble of low-strain, about $10^{10}$ NVs were addressed for low frequency electric-field spectroscopy. Optical excitation was provided with a single-pass of 532 nm incoherent beam through a 3 mm×3 mm×0.32 mm diamond (Type IIA, 1 ppb N, Element 6) with a <100> crystal orientations on the top and bottom 3 mm×3 mm surfaces. The bias and signal electric fields were applied across evaporated electrodes comprised of 10 nanometers of titanium, and 100 nm of gold (as depicted in FIGS. 8A and 8B). Using a complete set of Helmholtz coils (shown in FIG. D), the diamond electrometer was operated in a zero-bias magnetic field regime for optimal sensitivity to electric fields. Using the NV's high sensitivity to magnetic fields, the outer two transitions could be used to zero-the magnitude field across the entire diamond to within at least 30 nT of accuracy. Measurements were taken with a custom-built digital lock-in amplifier (LIA), which was driven by an Agilent signal generator.

Figure 10A:
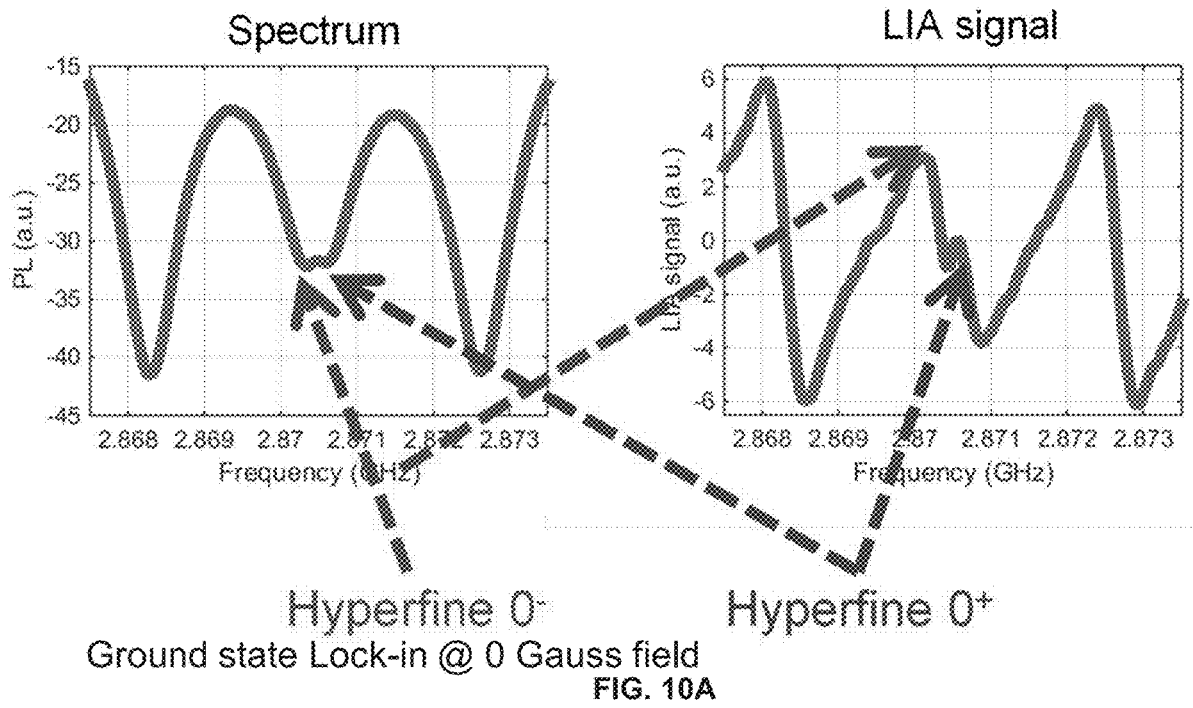
FIG. 10A shows measured ODMR spectral shifts (left) and a corresponding signal from a lock-in amplifier (LIA) (right) read from NVs in the ground state.
Figure 10B:
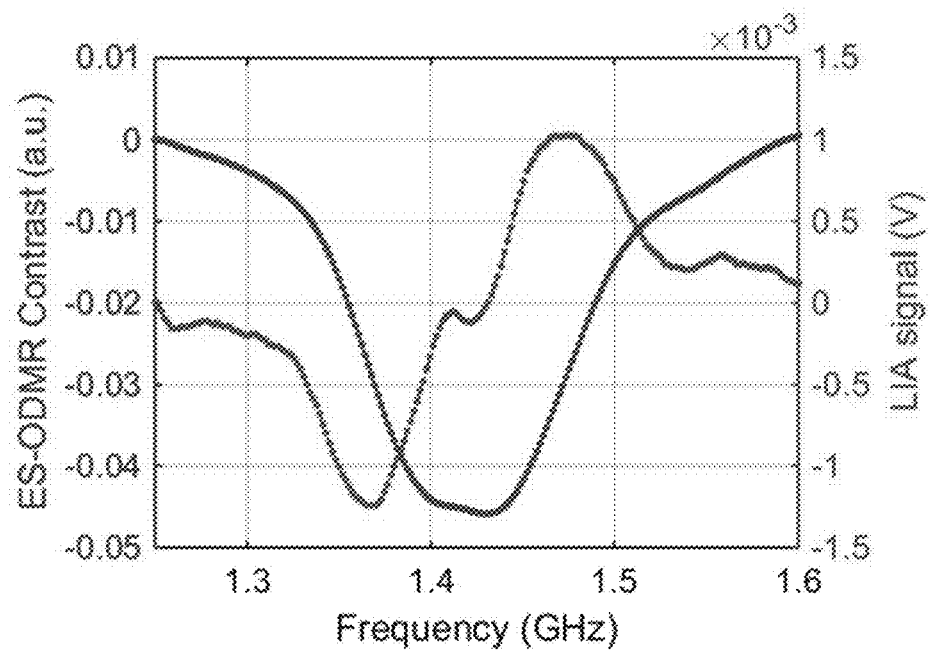
FIG. 10B shows measured ODMR shifts and the corresponding LIA signal, overlaid, from NVs in the excited state in an exemplary sample under a zero-bias magnetic field.

FIGS. 10A and 10B show results from a single NV in the ground state and in the excited-state, respectively, measured at zero magnetic field. FIG. 10A shows the ODMR spectrum (left) and the associated signal from the lock-in amplifier (LIA). The portions of the spectrum as well as the LIA signal corresponding to transitions from the hyperfine state −0 and +0 are indicated by arrows. The arrows also indicate hyperfine transitions that would be split by transverse electric field. The 0-Gauss magnetic field was aligned to within 900 Hz (30 nT) for all four orientations of the NV in the diamond lattice.

Similarly, FIG. 10B shows the ES-ODMR (excited state ODMR) spectrum on the left axis and the LIA signal on the right axis, overlaid.

As seen in Eqn. 3 (above), the intrinsic strain distribution in the ensemble of NVs determines the optimal operating bias voltage of the diamond electrometer. To have an accurate measurement of the strain distribution, a model can be derived to account for an isotropic distribution of strain with a Gamma function distribution of strain amplitudes. This model can be expressed in terms of the ensemble ODMR spectrum:

$$I_{\pm}(f) = 1 - \frac{1}{24\pi} \int_0^{2\pi} \int_0^{\pi} \int_0^{\infty} \frac{C_o \, P(x)}{4\left(\frac{f - (D_o \pm k_\perp E_o \infty \sin(\theta))}{\Delta f_o}\right)^2 + 1} x^2 \sin(\theta) dx d\theta d\phi$$

where f is the frequency of the applied MW field, $C_o$ is the ensemble average of the ODMR contrast, $D_o$ is the ensemble average of the crystal field, $P(x) = xe^{-x}$ is the (2,1) Gamma probability distribution of the strain magnitude, $E_o$ is the ensemble average of the strain magnitude, $\Delta f_o$ is the full-width half-maximum of single-NV line-widths, $\theta$ denotes the strain vector's altitude angle away from the NV⁻ symmetry axis, and $\phi$ is the strain vector's azimuthal angle. By fitting the ODMR spectra over several MW driving amplitudes, an example model consistently predicted an amplitude of electric field strain to be $\Pi_\perp \sim 170$ kHz.

Figure 11A:
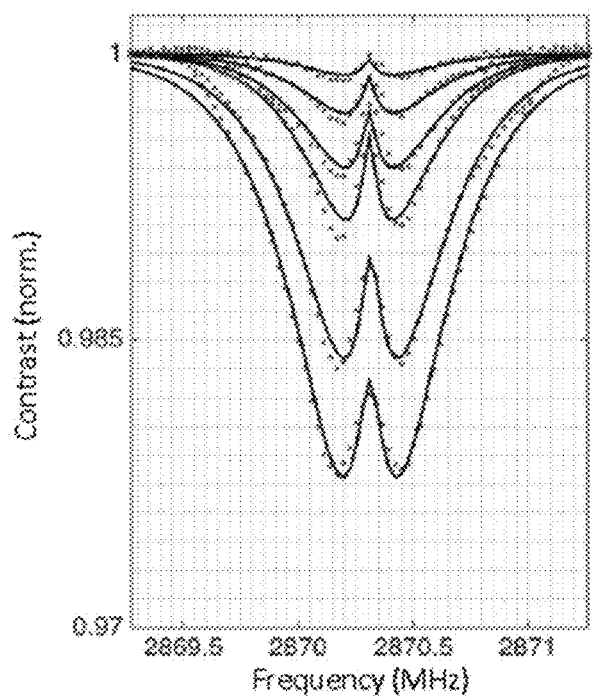
FIG. 11A shows measured and calculated ODMR spectra with various microwave (MW) field amplitudes and an applied electric field under a zero-bias magnetic field.
Figure 11B:
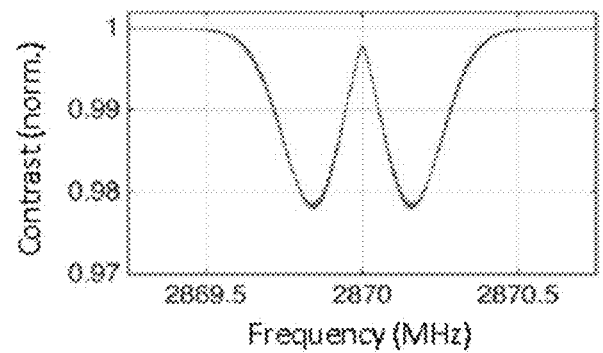
FIG. 11B shows results from exemplary numerical simulations under exemplary applied voltage.
Figure 11C:
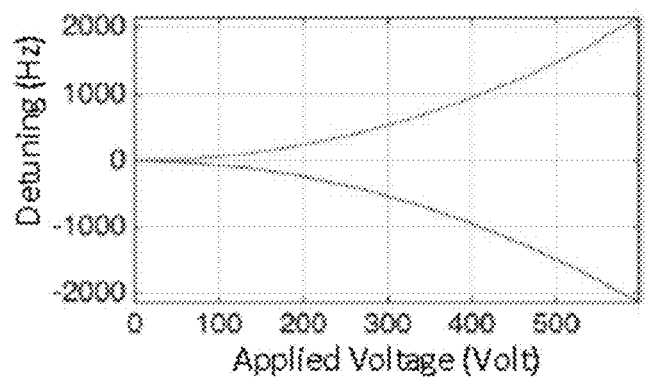
FIG. 11C shows numerically calculated detuning shifts corresponding to the various applied electric fields, from example experiments.

FIGS. 11A-11C show calculated and experimentally measured changes in ODMR spectrum, from the example calculations and experiments described above. Specifically, FIG. 11A shows experimentally measured ODMR (dotted lines) overlaid with numerical fits (solid lines) to a model which accounts for how transverse electric fields affect an ensemble of NVs, according to equations above, where the electric field is the applied voltage divided by the 320 μm electrode spacing. Each pair of lines (dotted and solid) corresponds to a different amplitude of MW drive. FIG. 11B shows the results from numerical simulations resulting in calculated ODMR spectrums at various applied voltages across a 320 μm thick diamond host. FIG. 11C shows the numerically calculated shifts, or detuning, in the strain transitions as a function of applied voltage.

Since it was possible to accurately measure the transition shift, the applied voltage, and the thickness of the diamond, it was also possible to measure the value of $d_\perp$ very accurately. By applying successively increasing voltages and monitoring the transition shift (shown in FIG. 12), one can deduce the value of $d_\perp$.

Figure 12:
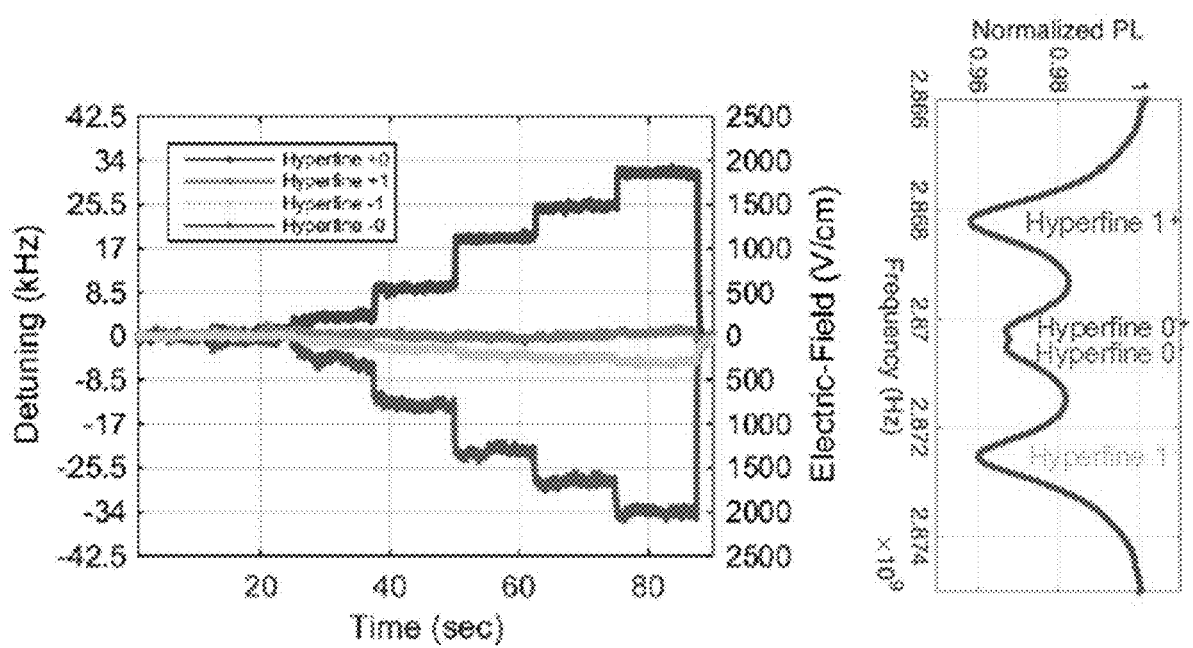
FIG. 12 shows the electric field dependence of the detuning shifts of an ensemble of NVs.

The main plot in FIG. 12 shows ground-state frequency shifts (detunings) due to incremental, step-wise increases in electric-field applied to an NV ensemble at zero magnetic field as a function of time. In this case, the ground-state detunings are more sensitive and have less noise than the excited-state detunings. The plot at right shows the ODMR spectrum of the ground state at the last time step. By comparing the step-wise detuning shifts of the electric-field transitions with the applied voltages, it is possible to accurately deduce the ensemble average value of $d_\perp$ to be 10 Hz/(V/cm).

Figure 13:
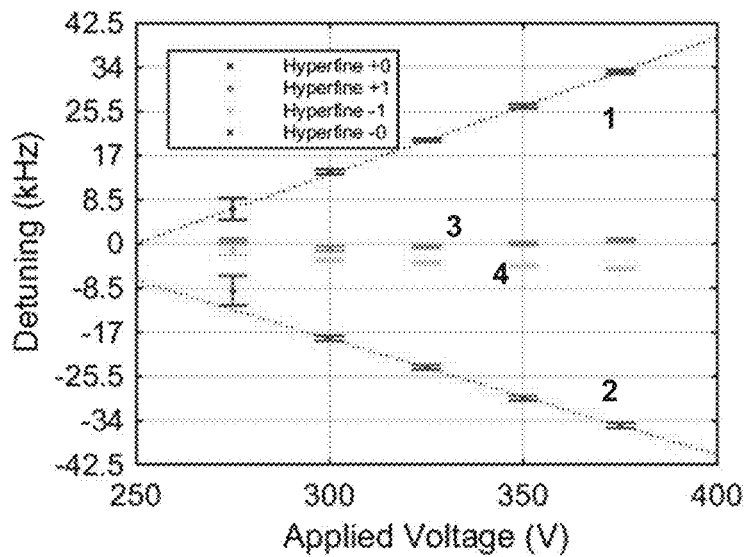
FIG. 13 shows the electric field sensitivity on electric field amplitude of an example apparatus and method.
Figure 13:
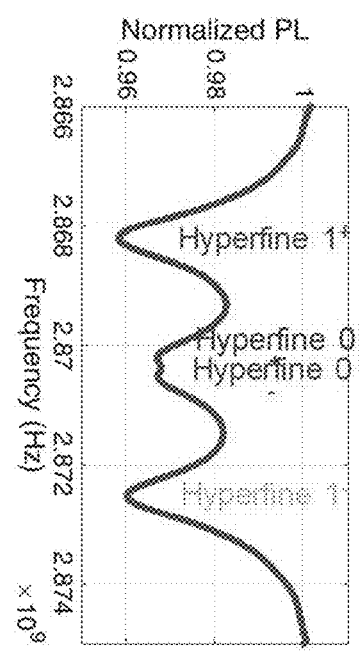

FIG. 13 is a plot showing the electric field sensitivity of an ensemble of NVs under zero-bias magnetic field as a function of applied voltage. As described above, lines 1 and 2 correspond to fits of measured detuning shifts from transitions associated with the hyperfine states +0 and −0 in response to increasing levels of applied electric fields. Lines 3 and 4 indicate points from measurements of shifts associated with the hyperfine states +1 and −1.

Figure 14:
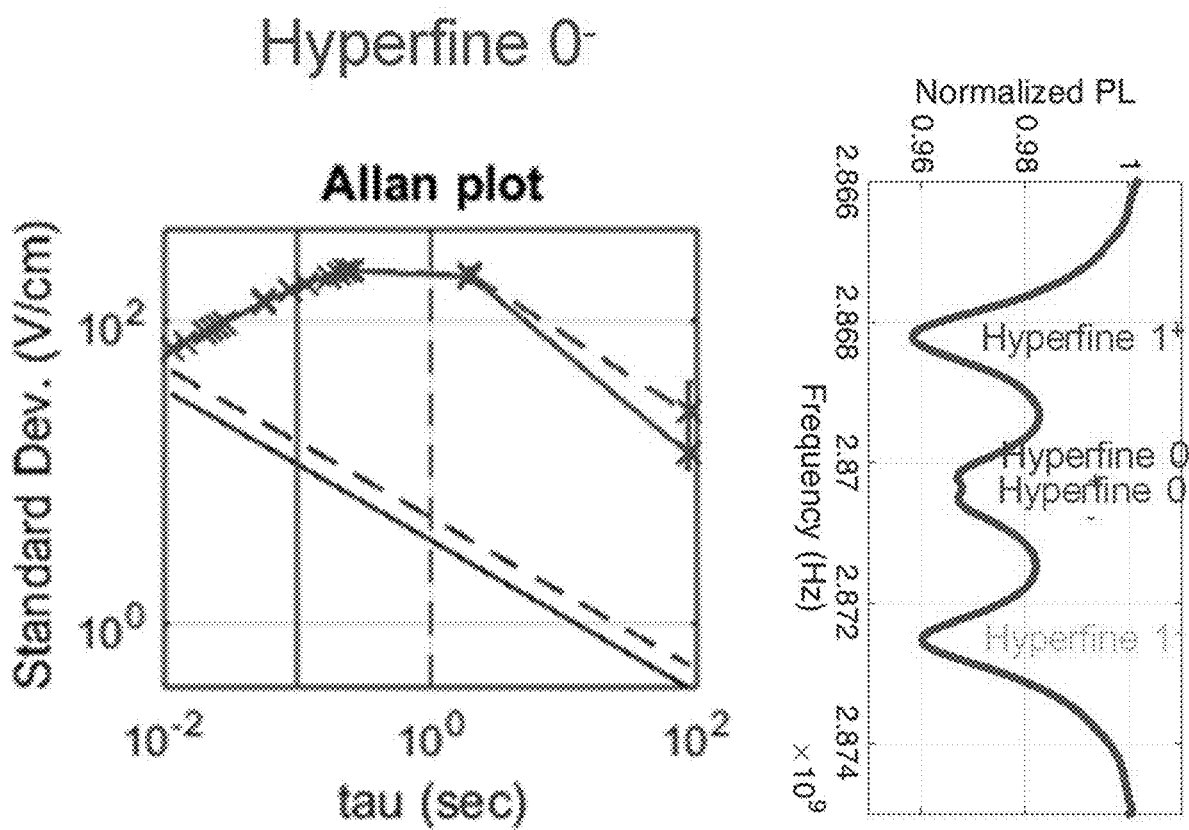
FIG. 14 shows an example Allan stability plot of the detuning shifts during electric field sensing.

FIG. 14 shows an Allan stability plot corresponding to the detuning shifts from transitions associated with the hyperfine state −0. This can be used to determine the electric sensitivity at different frequencies. The peak at 1 Hz is due to a sinusoidal applied field. The frequency roll-off at 10 Hz is due to the lock-in time constant.

The noise floor of the diamond electrometer can be accurately measured by applying a 1 Hz AC voltage across the sensor with a peak-to-peak voltage of 5 Volts and by monitoring both channels of the LIA to determine both amplitude and phase fluctuations. Using common-mode noise rejection one can remove any temperature fluctuations in the measurements down to at least 1 mK. The results from using one implementation of an electrometer according to the present application are shown in FIGS. 16-19.

FIGS. 15A and 16A show time traces of channel 1 (strain—transition) and channel 2 (strain+ transition), respectively, of the noise floor measurements. Each LIA channel corresponds to one transition. In order to measure the electric field independently of the temperature, two transitions (and therefore two LIA channels) should be monitored. FIGS. 15B and 16B show noise power spectral density plots of the traces in FIGS. 15A and 16A, respectively. The noise floor is shot-noise limited (black line), while there is a peak at the 1 Hz of 110 Hz/A/Hz.

Figure 17A:
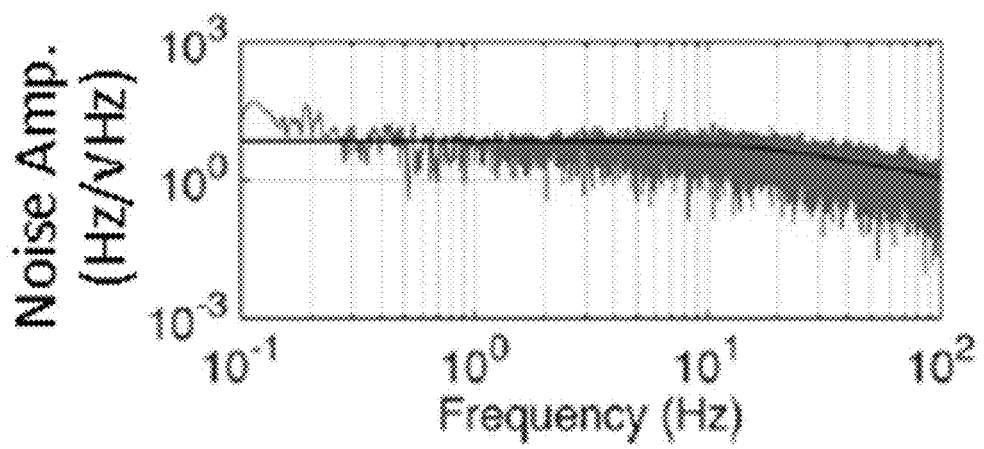
FIG. 17A shows the noise spectral density of the direct sum of channels 1 and 2 of the lock-in amplifier (corresponding to common mode fluctuations, typically caused by temperature fluctuations) shown in FIGS. 15A and 16A.
Figure 17B:
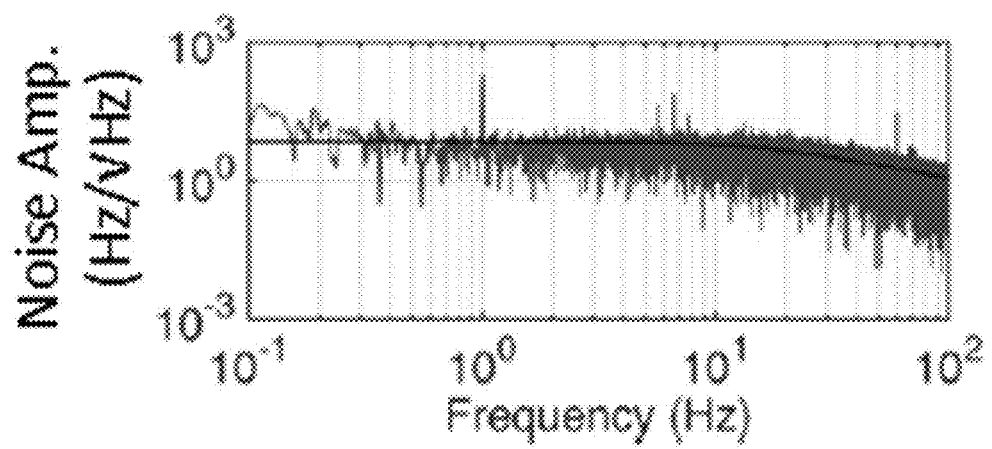
FIG. 17B shows the noise spectral density of the direct difference of channels 1 and 2 of the lock-in amplifier (corresponding to electric field fluctuations, while canceling temperature fluctuations) shown in FIGS. 16A and 17A.

FIG. 17A shows the noise spectral density of the direct sum of the two channels of the LIA, which corresponds to any common-mode fluctuations. The noise floor is shot-noise limited (black line). FIG. 17B shows the noise spectral density of the direct difference of the two channels, which corresponds to electric-field fluctuations. The noise floor is shot-noise limited (black line), while there is a peak at the 1 Hz of 212 Hz/A/Hz. This indicates that the difference between the two channels improves the SNR by the expected value of $\sqrt{2}$.

Figure 18A:
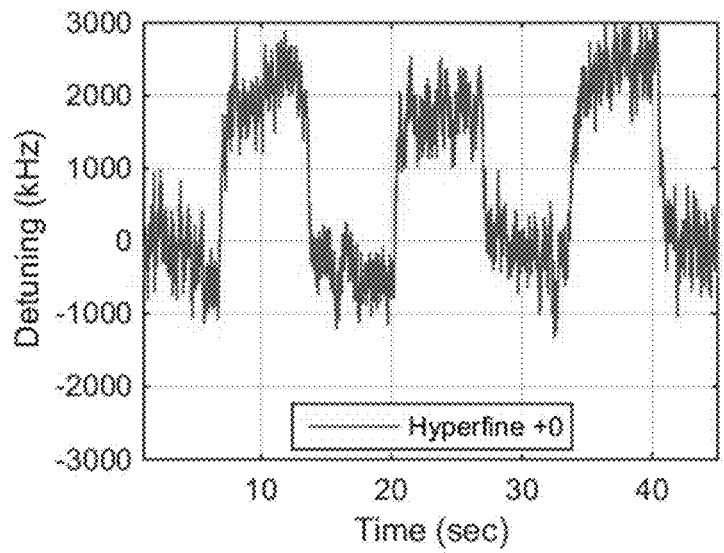
FIG. 18A shows an exemplary measurement of applied electric field in time using one example type of hyperfine state transitions of an ensemble of NVs.

FIG. 18A shows a time trace with the real-time measurement of applied electric field using transitions from the hyperfine state +0. The results were from measuring excited-state shifts due to incremental, step-wise electric-field applied to an NV ensemble at zero magnetic field. The sensitivity of this measurement now approached 300V/cm/A/Hz.

Figure 18B:
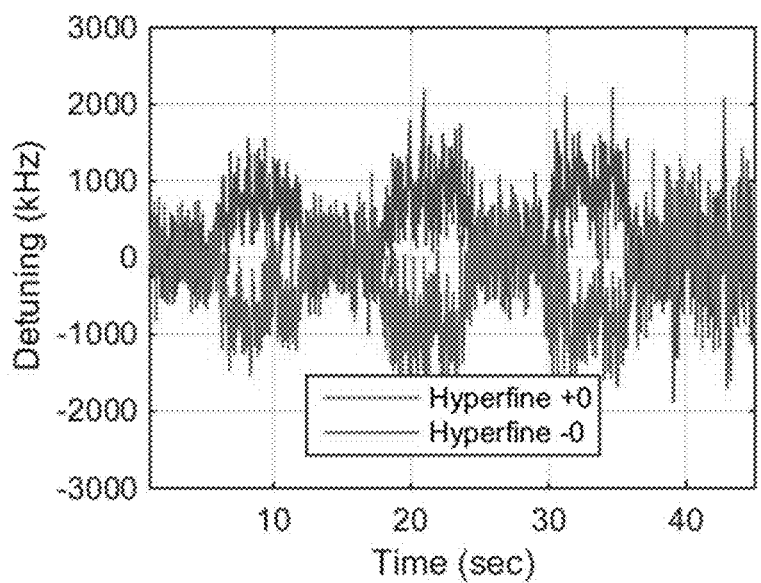
FIG. 18B shows overlaid time traces showing the differential effect of applied electric field from simultaneously measuring transitions associated with two hyperfine states, +0 and −0.

FIG. 18B shows excited state shifts measured from both transitions states, simultaneously.

In other implementations the crystal host can be from diamond samples with higher densities of NVs. The number/density of NVs can be manipulated to increase many fold for example by 10 to 100 times to accordingly modify the readout.

The crystal can also be chosen to have color centers with a higher electric-field shift in the ground state. In the case of the NV, the ground state has an electric field shift that is orders of magnitude smaller than that in the excited state. This is because the ground state has no intrinsic sensitivity but relies on a small mixing with the excited state. A color center with lower symmetry might be expected to have greater mixing and therefore greater electric sensitivity.

Further, electric fields with higher spatial resolution can be imaged using low-strain nanodiamonds under zero-magnetic field regime which can confer benefits of temperature and electric field sensing.

The excitation light source can be pulsed following protocols of pulsed excitation. Pulsed spectroscopic techniques can be employed similar to those applied to magnetometry, which are in turn are similar to those used in nuclear magnetic resonance imaging (MRI), but which have not yet to electrometry for improving the sensitivity of an NV electrometer. In some implementations, composite pulse sequences, such as BB(n) or OB(n), can be used to accommodate inhomogeneities. Composite pulse techniques offer a robust alternative to engineered field profiles. By combining a number of "elementary" radio-frequency pulses, it is possible to decouple gate fidelity from the control field amplitude to any desired degree. The recently developed OBn family of sequences offers superior performance over the widest possible range of control amplitudes, enabling precise ensemble control.

Additionally, the nuclear spin can be used for sensing by using a combination of nuclear-spin polarization techniques with using the long-lived coherence of the nuclear spin as an ancillary sensor. For example, rare earth doped crystals show electric shifts on the order of 10's of kHz/(V/cm). While the spin state of a single nucleus cannot be read out directly, a nearby NV or ST1 can readout individual nuclear spins with a high fidelity.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of measuring an external field with an ensemble of color centers in a solid-state host, the method comprising:
    applying a zero-bias magnetic field to the ensemble of color centers, the zero-bias magnetic field reducing splitting of an energy level of the ensemble of color centers caused by an ambient magnetic field experienced by the ensemble of color centers;
    subjecting the ensemble of color centers to the external field while the zero-bias magnetic field is applied to the ensemble of color centers;
    detecting a shift in a frequency of a ground state and/or an excited state of the ensemble of color centers caused by the external field; and
    estimating a magnitude of the external field based on the shift in the frequency of the ground state and/or the excited state of the ensemble of color centers.

2. The method of claim 1, wherein applying the zero-bias magnetic field to the ensemble of color centers comprises canceling an ambient magnetic field.

3. The method of claim 2, wherein canceling the ambient magnetic field comprises canceling the Earth's magnetic field.

4. The method of claim 1, wherein detecting the shift in the frequency of the ground state and/or the excited state of the ensemble of color centers comprises applying a microwave field to the ensemble of color centers.

5. The method of claim 4, wherein applying the microwave field comprises guiding the microwave field with a stripline in electromagnetic communication with the solid-state host.

6. The method of claim 4, wherein detecting the shift in the frequency of the ground state and/or the excited state of the ensemble of color centers further comprises:
    illuminating the ensemble of color centers with light selected as to spin-polarize the ensemble of color centers; and
    detecting photoluminescence emitted by the ensemble of color centers.

7. The method of claim 1, wherein estimating the magnitude of the electric field comprises estimating a shift in the frequency of the ground state of the ensemble of color centers caused by a change in temperature of the ensemble of color centers.

8. The method of claim 1, wherein estimating the magnitude of the external field comprises estimating the magnitude over a frequency range of 0 Hz to 100 Hz with a shot-nose limited sensitivity of 1 V/cm $\sqrt{Hz}$.

9. The method of claim 1, further comprising:
    estimating a direction of the external field based on the shift in the frequency of the ground state and/or the excited state of the ensemble of color centers.

10. The method of claim 1, further comprising:
    estimating a noise spectral density of external field fluctuations within the solid-state host based on the shift in the frequency of the ground state and/or the excited state of the ensemble of color centers.

11. A sensor comprising:
    a solid-state host having an ensemble of color centers;
    a magnetic field generator, in electromagnetic communication with the ensemble of color centers, to apply a zero-bias magnetic field to the ensemble of color centers, the zero-bias magnetic field reducing splitting of an energy level of the ensemble of color centers caused by an ambient magnetic field experienced by the ensemble of color centers;
    a detector, in electromagnetic communication with the ensemble of color centers, to detect a shift in a frequency of a ground state and/or an excited state of the ensemble of color centers caused by an external field; and
    a processor, operably coupled to the detector, to estimate a magnitude of the external field based on the shift in the frequency of the ground state and/or the excited state of the ensemble of color centers.

12. The sensor of claim 11, wherein the ensemble of color centers comprises at least $10^{10}$ color centers.

13. The sensor of claim 11, wherein the magnetic field generator is configured to cancel an ambient magnetic field.

14. The sensor of claim 11, further comprising:
    a light source, in optical communication with the solid-state host, to illuminate the ensemble of color centers with light selected to spin polarize the ensemble of color centers.

15. The sensor of claim 11, further comprising:
a microwave source, in electromagnetic communication with the solid-state host, to apply a microwave field to the ensemble of color centers.

16. The sensor of claim 15, further comprising:
a stripline, bonded to the solid-state host and in electrical communication with the microwave source, to guide the microwave.

17. The sensor of claim 11, wherein the processor is configured to estimate a shift in the frequency of the ground state of the ensemble of color centers caused by a change in temperature of the ensemble of color centers.

18. The sensor of claim 11, wherein the processor is configured to estimate the magnitude of the external field over a frequency range of 0 Hz to 100 Hz with a shot-nose limited sensitivity of 1 V/cm $\sqrt{Hz}$.

19. The sensor of claim 11, wherein the processor is configured to estimate a direction of the external field based on the shift in the frequency of the ground state and/or the excited state of the ensemble of color centers.

20. The sensor of claim 11, wherein the processor is configured to estimate a noise spectral density of external field fluctuations within the solid-state host based on the shift in the frequency of the ground state and/or the excited state of the ensemble of color centers.

* * * * *